(12) United States Patent
Rafferty et al.

(10) Patent No.: US 10,032,709 B2
(45) Date of Patent: *Jul. 24, 2018

(54) EMBEDDING THIN CHIPS IN POLYMER

(71) Applicant: MC10, Inc., Lexington, MA (US)

(72) Inventors: Conor Rafferty, Newton, MA (US); Mitul Dalal, South Grafton, MA (US)

(73) Assignee: MC10, INC., Lexington, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/412,993

(22) Filed: Jan. 23, 2017

(65) Prior Publication Data

US 2017/0200670 A1    Jul. 13, 2017

Related U.S. Application Data

(63) Continuation of application No. 14/859,112, filed on Sep. 18, 2015, now Pat. No. 9,583,428, which is a (Continued)

(51) Int. Cl.
*H01L 23/02* (2006.01)
*H01L 23/498* (2006.01)
(Continued)

(52) U.S. Cl.
CPC .......... *H01L 23/4985* (2013.01); *H01L 21/56* (2013.01); *H01L 21/6836* (2013.01);
(Continued)

(58) Field of Classification Search
CPC ............. H01L 23/3107; H01L 23/3121; H01L 23/49822; H01L 23/49827; H01L 23/5389;
(Continued)

(56) References Cited

U.S. PATENT DOCUMENTS 3,716,861 A    2/1973  Root
3,805,427 A    4/1974  Epstein
(Continued)

FOREIGN PATENT DOCUMENTS

CN        1604723 A      4/2005
CN     101276794 A     10/2008
(Continued)

OTHER PUBLICATIONS

Carvalhal et al., "Electrochemical Detection in a Paper-Based Separation Device", Analytical Chemistry, vol. 82, No. 3, (1162-1165) (4 pages) (Jan. 7, 2010).
(Continued)

*Primary Examiner* — Yosef Gebreyesus
(74) *Attorney, Agent, or Firm* — Nixon Peabody LLP

(57) ABSTRACT

Systems and methods are provided for the embedding of thin chips. A well region is generated in a substrate that includes a conductive material disposed on a flexible polymer. The standoff well region can be generated by pattern the conductive material, where the thin chip is embedded in the standoff well region. A cavity can be generated in the polymer layer to form a polymer well region, where the thin chip is embedded in the polymer well region.

19 Claims, 12 Drawing Sheets

Related U.S. Application Data continuation of application No. 13/844,638, filed on Mar. 15, 2013, now Pat. No. 9,171,794.

(60) Provisional application No. 61/711,629, filed on Oct. 9, 2012.

(51) Int. Cl.

| | | |
|---|---|---|
| *H01L 23/538* | (2006.01) | |
| *H01L 23/31* | (2006.01) | |
| *H01L 23/16* | (2006.01) | |
| *H01L 21/56* | (2006.01) | |
| *H01L 23/00* | (2006.01) | |
| *H01L 21/683* | (2006.01) | |
| *H05K 1/02* | (2006.01) | |
| *H05K 1/18* | (2006.01) | |

(52) U.S. Cl.
CPC .......... *H01L 23/16* (2013.01); *H01L 23/3107* (2013.01); *H01L 23/3121* (2013.01); *H01L 23/49822* (2013.01); *H01L 23/49827* (2013.01); *H01L 23/5389* (2013.01); *H01L 24/03* (2013.01); *H01L 24/05* (2013.01); *H01L 24/06* (2013.01); *H01L 24/29* (2013.01); *H01L 24/82* (2013.01); *H05K 1/189* (2013.01); *H01L 2221/68327* (2013.01); *H01L 2221/68381* (2013.01); *H01L 2224/02379* (2013.01); *H01L 2224/036* (2013.01); *H01L 2224/03436* (2013.01); *H01L 2224/0401* (2013.01); *H01L 2224/04105* (2013.01); *H01L 2224/05144* (2013.01); *H01L 2224/05155* (2013.01); *H01L 2224/05166* (2013.01); *H01L 2224/05171* (2013.01); *H01L 2224/05184* (2013.01); *H01L 2224/05548* (2013.01); *H01L 2224/293* (2013.01); *H01L 2224/2919* (2013.01); *H01L 2224/2929* (2013.01); *H01L 2224/32225* (2013.01); *H01L 2224/32245* (2013.01); *H01L 2224/73267* (2013.01); *H01L 2224/8203* (2013.01); *H01L 2224/82039* (2013.01); *H01L 2224/83132* (2013.01); *H01L 2224/83192* (2013.01); *H01L 2224/92244* (2013.01); *H01L 2924/07802* (2013.01); *H01L 2924/12042* (2013.01); *H01L 2924/12043* (2013.01); *H01L 2924/15153* (2013.01); *H05K 1/0283* (2013.01); *H05K 1/185* (2013.01); *H05K 2203/1469* (2013.01)

(58) Field of Classification Search
CPC ......... H01L 24/03; H01L 24/05; H01L 24/06; H01L 24/29; H01L 24/82; H01L 21/56; H01L 21/6836; H01L 21/683; H01L 23/4985; H05K 1/189; H05K 1/185; H05K 2203/1469

See application file for complete search history.

(56) References Cited

U.S. PATENT DOCUMENTS

| | | | |
|---|---|---|---|
| 3,838,240 A | 9/1974 | Schelhorn | |
| 4,278,474 A | 7/1981 | Blakeslee | |
| 4,304,235 A | 12/1981 | Kaufman | |
| 4,416,288 A | 11/1983 | Freeman | |
| 4,658,153 A | 4/1987 | Brosh | |
| 4,911,169 A | 3/1990 | Ferrari | |
| 5,059,424 A | 10/1991 | Cartmell | |
| 5,272,375 A | 12/1993 | Belopolsky | |
| 5,306,917 A | 4/1994 | Black | |
| 5,326,521 A | 7/1994 | East | |
| 5,331,966 A | 7/1994 | Bennett | |
| 5,360,987 A | 11/1994 | Shibib | |
| 5,471,982 A | 5/1995 | Edwards | |
| 5,454,270 A | 10/1995 | Brown | |
| 5,491,651 A | 2/1996 | Janic | |
| 5,567,975 A | 10/1996 | Walsh | |
| 5,580,794 A | 12/1996 | Allen | |
| 5,617,870 A | 4/1997 | Hastings | |
| 5,811,790 A | 9/1998 | Endo | |
| 5,817,008 A | 10/1998 | Rafert | |
| 5,907,477 A | 5/1999 | Tuttle | |
| 6,063,046 A | 5/2000 | Allum | |
| 6,220,916 B1 | 4/2001 | Bart | |
| 6,265,090 B1 | 7/2001 | Nishide | |
| 6,282,960 B1 | 9/2001 | Samuels | |
| 6,343,514 B1 | 2/2002 | Smith | |
| 6,387,052 B1 | 5/2002 | Quinn | |
| 6,410,971 B1 | 6/2002 | Otey | |
| 6,421,016 B1 | 7/2002 | Phillips | |
| 6,450,026 B1 | 9/2002 | Desarnaud | |
| 6,455,931 B1 | 9/2002 | Hamilton | |
| 6,567,158 B1 | 5/2003 | Falcial | |
| 6,626,940 B2 | 9/2003 | Crowley | |
| 6,628,987 B1 | 9/2003 | Hill | |
| 6,641,860 B1 | 11/2003 | Kaiserman | |
| 6,775,906 B1 | 8/2004 | Silverbrook | |
| 6,784,844 B1 | 8/2004 | Boakes | |
| 6,965,160 B2 | 11/2005 | Cobbley | |
| 6,987,314 B1 | 1/2006 | Yoshida | |
| 7,259,030 B2 | 8/2007 | Daniels | |
| 7,265,298 B2 | 9/2007 | Maghribi | |
| 7,302,751 B2 | 12/2007 | Hamburgen | |
| 7,337,012 B2 | 2/2008 | Maghribi | |
| 7,487,587 B2 | 2/2009 | Vanfleteren | |
| 7,491,892 B2 | 2/2009 | Wagner | |
| 7,521,292 B2 | 4/2009 | Rogers | |
| 7,557,367 B2 | 7/2009 | Rogers | |
| 7,618,260 B2 | 11/2009 | Daniel | |
| 7,622,367 B1 | 11/2009 | Nuzzo | |
| 7,727,228 B2 | 6/2010 | Abboud | |
| 7,739,791 B2 | 6/2010 | Brandenburg | |
| 7,759,167 B2 | 7/2010 | Vanfleteren | |
| 7,815,095 B2 | 10/2010 | Fujisawa | |
| 7,960,246 B2 | 6/2011 | Flamand | |
| 7,982,296 B2 | 7/2011 | Nuzzo | |
| 8,097,926 B2 | 1/2012 | De Graff | |
| 8,198,621 B2 | 6/2012 | Rogers | |
| 8,207,473 B2 | 6/2012 | Axisa | |
| 8,217,381 B2 | 7/2012 | Rogers | |
| 8,332,053 B1 | 12/2012 | Patterson | |
| 8,372,726 B2 | 2/2013 | De Graff | |
| 8,389,862 B2 | 3/2013 | Arora | |
| 8,431,828 B2 | 4/2013 | Vanfleteren | |
| 8,440,546 B2 | 5/2013 | Nuzzo | |
| 8,536,667 B2 | 9/2013 | De Graff | |
| 8,552,299 B2 | 10/2013 | Rogers | |
| 8,618,656 B2 | 12/2013 | Oh | |
| 8,664,699 B2 | 3/2014 | Nuzzo | |
| 8,679,888 B2 | 3/2014 | Rogers | |
| 8,729,524 B2 | 5/2014 | Rogers | |
| 8,754,396 B2 | 6/2014 | Rogers | |
| 8,865,489 B2 | 10/2014 | Rogers | |
| 8,886,334 B2 | 11/2014 | Ghaffari | |
| 8,905,772 B2 | 12/2014 | Rogers | |
| 9,012,784 B2 | 4/2015 | Arora | |
| 9,082,025 B2 | 7/2015 | Fastert | |
| 9,105,555 B2 | 8/2015 | Rogers | |
| 9,105,782 B2 | 8/2015 | Rogers | |
| 9,107,592 B2 | 8/2015 | Litt | |
| 9,119,533 B2 | 9/2015 | Ghaffari | |
| 9,123,614 B2 | 9/2015 | Graff | |
| 9,159,635 B2 | 10/2015 | Elolampi | |
| 9,168,094 B2 | 10/2015 | Lee | |
| 9,171,794 B2 * | 10/2015 | Rafferty | ............... H01L 23/4985 |
| 9,186,060 B2 | 11/2015 | De Graff | |
| 9,226,402 B2 | 12/2015 | Hsu | |
| 9,247,637 B2 | 1/2016 | Hsu | |
| 9,289,132 B2 | 3/2016 | Ghaffari | |
| 9,295,842 B2 | 3/2016 | Ghaffari | |
| 9,320,907 B2 | 4/2016 | Bogie | |

(56) References Cited

U.S. PATENT DOCUMENTS

| | | |
|---|---|---|
| 9,324,733 B2 | 4/2016 | Rogers |
| 9,372,123 B2 | 6/2016 | Li |
| 9,408,305 B2 | 8/2016 | Hsu |
| 9,420,953 B2 | 8/2016 | Litt |
| 9,450,043 B2 | 9/2016 | Nuzzo |
| 9,515,025 B2 | 12/2016 | Rogers |
| 9,516,758 B2 | 12/2016 | Arora |
| 9,545,216 B2 | 1/2017 | D'Angelo |
| 9,545,285 B2 | 1/2017 | Ghaffari |
| 9,554,850 B2 | 1/2017 | Lee |
| 9,579,040 B2 | 2/2017 | Rafferty |
| 9,583,428 B2 * | 2/2017 | Rafferty ............. H01L 23/4985 |
| D781,270 S | 3/2017 | Li |
| 9,622,680 B2 | 4/2017 | Ghaffari |
| 9,647,171 B2 | 5/2017 | Rogers |
| 2001/0012918 A1 | 8/2001 | Swanson |
| 2001/0021867 A1 | 9/2001 | Kordis |
| 2002/0000813 A1 | 1/2002 | Hirono |
| 2002/0026127 A1 | 2/2002 | Balbierz |
| 2002/0079572 A1 | 6/2002 | Khan |
| 2002/0082515 A1 | 6/2002 | Campbell |
| 2002/0094701 A1 | 7/2002 | Biegelsen |
| 2002/0113739 A1 | 8/2002 | Howard |
| 2002/0128700 A1 | 9/2002 | Cross, Jr. |
| 2002/0145467 A1 | 10/2002 | Minch |
| 2002/0151934 A1 | 10/2002 | Levine |
| 2002/0158330 A1 | 10/2002 | Moon |
| 2002/0173730 A1 | 11/2002 | Pottgen |
| 2002/0193724 A1 | 12/2002 | Stebbings |
| 2003/0017848 A1 | 1/2003 | Engstrom |
| 2003/0045025 A1 | 3/2003 | Coyle |
| 2003/0063445 A1 * | 4/2003 | Fischbach ............ G06K 9/0002 361/752 |
| 2003/0097165 A1 | 5/2003 | Krulevitch |
| 2003/0120271 A1 | 6/2003 | Burnside |
| 2003/0162507 A1 | 8/2003 | Vatt |
| 2003/0214408 A1 | 11/2003 | Grajales |
| 2003/0236455 A1 | 12/2003 | Swanson |
| 2004/0006264 A1 | 1/2004 | Mojarradi |
| 2004/0085469 A1 | 5/2004 | Johnson |
| 2004/0092806 A1 | 5/2004 | Sagon |
| 2004/0106334 A1 | 6/2004 | Suzuki |
| 2004/0118831 A1 | 6/2004 | Martin |
| 2004/0135094 A1 | 7/2004 | Niigaki |
| 2004/0138558 A1 | 7/2004 | Dunki-Jacobs |
| 2004/0149921 A1 | 8/2004 | Smyk |
| 2004/0178466 A1 | 9/2004 | Merrill |
| 2004/0192082 A1 | 9/2004 | Wagner |
| 2004/0201134 A1 | 10/2004 | Kawai |
| 2004/0203486 A1 | 10/2004 | Shepherd |
| 2004/0221370 A1 | 11/2004 | Hannula |
| 2004/0238819 A1 | 12/2004 | Maghribi |
| 2004/0243204 A1 | 12/2004 | Maghribi |
| 2005/0021103 A1 | 1/2005 | DiLorenzo |
| 2005/0029680 A1 | 2/2005 | Jung |
| 2005/0067293 A1 | 3/2005 | Naito |
| 2005/0070778 A1 | 3/2005 | Lackey |
| 2005/0096513 A1 | 5/2005 | Ozguz |
| 2005/0113744 A1 | 5/2005 | Donoghue |
| 2005/0139683 A1 | 6/2005 | Yi |
| 2005/0171524 A1 | 8/2005 | Stern |
| 2005/0203366 A1 | 9/2005 | Donoghue |
| 2005/0248312 A1 | 11/2005 | Cao |
| 2005/0261617 A1 | 11/2005 | Hall |
| 2005/0258050 A1 | 12/2005 | Bruce |
| 2005/0285262 A1 | 12/2005 | Knapp |
| 2006/0003709 A1 | 1/2006 | Wood |
| 2006/0038182 A1 | 2/2006 | Rogers |
| 2006/0071349 A1 | 4/2006 | Tokushige |
| 2006/0084394 A1 | 4/2006 | Engstrom |
| 2006/0106321 A1 | 5/2006 | Lewinsky |
| 2006/0122298 A1 | 6/2006 | Menon |
| 2006/0128346 A1 | 6/2006 | Yasui |
| 2006/0154398 A1 | 7/2006 | Qing |
| 2006/0160560 A1 | 7/2006 | Josenhans |
| 2006/0248946 A1 | 11/2006 | Howell |
| 2006/0257945 A1 | 11/2006 | Masters |
| 2006/0264767 A1 | 11/2006 | Shennib |
| 2006/0270135 A1 | 11/2006 | Chrysler |
| 2006/0286785 A1 | 12/2006 | Rogers |
| 2007/0027514 A1 | 2/2007 | Gerber |
| 2007/0031283 A1 | 2/2007 | Davis |
| 2007/0108389 A1 | 5/2007 | Makela |
| 2007/0113399 A1 | 5/2007 | Kumar |
| 2007/0123756 A1 | 5/2007 | Kitaj Ima |
| 2007/0139451 A1 | 6/2007 | Somasiri |
| 2007/0179373 A1 | 8/2007 | Pronovost |
| 2007/0190880 A1 | 8/2007 | Dubrow |
| 2007/0270672 A1 | 11/2007 | Hayter |
| 2007/0270674 A1 | 11/2007 | Kane |
| 2008/0036097 A1 | 2/2008 | Ito |
| 2008/0046080 A1 | 2/2008 | Vanden Bulcke |
| 2008/0074383 A1 | 3/2008 | Dean |
| 2008/0096620 A1 | 4/2008 | Lee |
| 2008/0139894 A1 | 6/2008 | Szydlo-Moore |
| 2008/0157235 A1 | 7/2008 | Rogers |
| 2008/0185534 A1 | 8/2008 | Simon |
| 2008/0188912 A1 | 8/2008 | Stone |
| 2008/0193749 A1 | 8/2008 | Thompson |
| 2008/0200973 A1 | 8/2008 | Mallozzi |
| 2008/0204021 A1 | 8/2008 | Leussler |
| 2008/0211087 A1 | 9/2008 | Mueller-Hipper |
| 2008/0237840 A1 | 10/2008 | Alcoe |
| 2008/0259576 A1 | 10/2008 | Johnson |
| 2008/0262381 A1 | 10/2008 | Kolen |
| 2008/0287167 A1 | 11/2008 | Caine |
| 2008/0313552 A1 | 12/2008 | Buehler |
| 2009/0000377 A1 | 1/2009 | Shipps |
| 2009/0001550 A1 | 1/2009 | Li |
| 2009/0015560 A1 | 1/2009 | Robinson |
| 2009/0017884 A1 | 1/2009 | Rotschild |
| 2009/0048556 A1 | 2/2009 | Durand |
| 2009/0076363 A1 | 3/2009 | Bly |
| 2009/0088750 A1 | 4/2009 | Hushka |
| 2009/0107704 A1 | 4/2009 | Vanfleteren |
| 2009/0154736 A1 | 6/2009 | Lee |
| 2009/0184254 A1 | 7/2009 | Miura |
| 2009/0204168 A1 | 8/2009 | Kallmeyer |
| 2009/0215385 A1 | 8/2009 | Waters |
| 2009/0225751 A1 | 9/2009 | Koenck |
| 2009/0261828 A1 | 10/2009 | Nordmeyer-Massner |
| 2009/0273909 A1 | 11/2009 | Shin |
| 2009/0283891 A1 | 11/2009 | Dekker |
| 2009/0291508 A1 | 11/2009 | Babu |
| 2009/0294803 A1 | 12/2009 | Nuzzo |
| 2009/0317639 A1 | 12/2009 | Axisa |
| 2009/0322480 A1 | 12/2009 | Benedict |
| 2010/0002402 A1 | 1/2010 | Rogers |
| 2010/0030167 A1 | 2/2010 | Thirstrup |
| 2010/0059863 A1 | 3/2010 | Rogers |
| 2010/0072577 A1 | 3/2010 | Nuzzo |
| 2010/0073669 A1 | 3/2010 | Colvin |
| 2010/0087782 A1 | 4/2010 | Ghaffari |
| 2010/0090781 A1 | 4/2010 | Yamamoto |
| 2010/0090824 A1 | 4/2010 | Rowell |
| 2010/0116526 A1 | 5/2010 | Arora |
| 2010/0117660 A1 | 5/2010 | Douglas |
| 2010/0178722 A1 | 7/2010 | De Graff |
| 2010/0245011 A1 | 9/2010 | Chatzopoulos |
| 2010/0271191 A1 | 10/2010 | De Graff |
| 2010/0298895 A1 | 11/2010 | Ghaffari |
| 2010/0317132 A1 | 12/2010 | Rogers |
| 2010/0321161 A1 | 12/2010 | Isabell |
| 2010/0327387 A1 | 12/2010 | Kasai |
| 2011/0011179 A1 | 1/2011 | Gustafsson |
| 2011/0034760 A1 | 2/2011 | Brynelsen |
| 2011/0034912 A1 | 2/2011 | De Graff |
| 2011/0051384 A1 | 3/2011 | Kriechbaum |
| 2011/0054583 A1 | 3/2011 | Litt |
| 2011/0071603 A1 | 3/2011 | Moore |
| 2011/0098583 A1 | 4/2011 | Pandia |
| 2011/0101789 A1 | 5/2011 | Salter |
| 2011/0121822 A1 | 5/2011 | Parsche |
| 2011/0140856 A1 | 6/2011 | Downie |

(56) References Cited

U.S. PATENT DOCUMENTS

| | | |
|---|---|---|
| 2011/0140897 A1 | 6/2011 | Purks |
| 2011/0175735 A1 | 7/2011 | Forster |
| 2011/0184320 A1 | 7/2011 | Shipps |
| 2011/0185611 A1 | 8/2011 | Adams |
| 2011/0213559 A1 | 9/2011 | Pollack |
| 2011/0215931 A1 | 9/2011 | Callsen |
| 2011/0218756 A1 | 9/2011 | Callsen |
| 2011/0218757 A1 | 9/2011 | Callsen |
| 2011/0220890 A1 | 9/2011 | Nuzzo |
| 2011/0222375 A1 | 9/2011 | Tsubata |
| 2011/0263950 A1 | 10/2011 | Larson |
| 2011/0277813 A1 | 11/2011 | Rogers |
| 2011/0284268 A1 | 11/2011 | Palaniswamy |
| 2011/0306851 A1 | 12/2011 | Wang |
| 2011/0317737 A1 | 12/2011 | Klewer |
| 2012/0016258 A1 | 1/2012 | Webster |
| 2012/0051005 A1 | 3/2012 | Vanfleteren |
| 2012/0052268 A1 | 3/2012 | Axisa |
| 2012/0065937 A1 | 3/2012 | De Graff |
| 2012/0074546 A1 | 3/2012 | Chong |
| 2012/0087216 A1 | 4/2012 | Keung |
| 2012/0091594 A1 | 4/2012 | Landesberger |
| 2012/0092178 A1 | 4/2012 | Callsen |
| 2012/0092222 A1 | 4/2012 | Kato |
| 2012/0101413 A1 | 4/2012 | Beetel |
| 2012/0101538 A1 | 4/2012 | Ballakur |
| 2012/0108012 A1 | 5/2012 | Yasuda |
| 2012/0126418 A1 | 5/2012 | Feng |
| 2012/0150072 A1 | 6/2012 | Revol-Cavalier |
| 2012/0157804 A1 | 6/2012 | Rogers |
| 2012/0165759 A1 | 6/2012 | Rogers |
| 2012/0172697 A1 | 7/2012 | Urman |
| 2012/0178367 A1 | 7/2012 | Matsumoto |
| 2012/0220835 A1 | 8/2012 | Chung |
| 2012/0226130 A1 | 9/2012 | De Graff |
| 2012/0244848 A1 | 9/2012 | Ghaffari |
| 2012/0256308 A1 | 10/2012 | Helin |
| 2012/0316455 A1 | 12/2012 | Rahman |
| 2012/0327608 A1 | 12/2012 | Rogers |
| 2013/0041235 A1 | 2/2013 | Rogers |
| 2013/0044215 A1 | 2/2013 | Rothkopf |
| 2013/0085552 A1 | 4/2013 | Mandel |
| 2013/0099358 A1 | 4/2013 | Elolampi |
| 2013/0100618 A1 | 4/2013 | Rogers |
| 2013/0116520 A1 | 5/2013 | Roham |
| 2013/0118255 A1 | 5/2013 | Callsen |
| 2013/0123587 A1 | 5/2013 | Sarrafzadeh |
| 2013/0150693 A1 | 6/2013 | D'angelo |
| 2013/0185003 A1 | 7/2013 | Carbeck |
| 2013/0192356 A1 | 8/2013 | De Graff |
| 2013/0197319 A1 | 8/2013 | Monty |
| 2013/0200268 A1 | 8/2013 | Rafferty |
| 2013/0211761 A1 | 8/2013 | Brandsma |
| 2013/0214300 A1 | 8/2013 | Lerman |
| 2013/0215467 A1 | 8/2013 | Fein |
| 2013/0225965 A1 | 8/2013 | Ghaffari |
| 2013/0237150 A1 | 9/2013 | Royston |
| 2013/0245388 A1 | 9/2013 | Rafferty |
| 2013/0253285 A1 | 9/2013 | Bly |
| 2013/0274562 A1 | 10/2013 | Ghaffari |
| 2013/0285836 A1 | 10/2013 | Proud |
| 2013/0313713 A1 | 11/2013 | Arora |
| 2013/0316442 A1 | 11/2013 | Meurville |
| 2013/0316487 A1 | 11/2013 | De Graff |
| 2013/0316645 A1 | 11/2013 | Li |
| 2013/0320503 A1 | 12/2013 | Nuzzo |
| 2013/0321373 A1 | 12/2013 | Yoshizumi |
| 2013/0325357 A1 | 12/2013 | Walerow |
| 2013/0328219 A1 | 12/2013 | Chau |
| 2013/0331914 A1 | 12/2013 | Lee |
| 2014/0001058 A1 | 1/2014 | Ghaffari |
| 2014/0012160 A1 | 1/2014 | Ghaffari |
| 2014/0012242 A1 | 1/2014 | Lee |
| 2014/0022746 A1 | 1/2014 | Hsu |
| 2014/0039290 A1 | 2/2014 | De Graff |
| 2014/0097944 A1 | 4/2014 | Fastert |
| 2014/0110859 A1 | 4/2014 | Rafferty |
| 2014/0125458 A1 | 5/2014 | Bachman |
| 2014/0140020 A1 | 5/2014 | Rogers |
| 2014/0188426 A1 | 7/2014 | Fastert |
| 2014/0191236 A1 | 7/2014 | Nuzzo |
| 2014/0206976 A1 | 7/2014 | Thompson |
| 2014/0216524 A1 | 8/2014 | Rogers |
| 2014/0240932 A1 | 8/2014 | Hsu |
| 2014/0240985 A1* | 8/2014 | Kim ................ H05K 1/028 362/249.04 |
| 2014/0249520 A1 | 9/2014 | Ghaffari |
| 2014/0275835 A1 | 9/2014 | Lamego |
| 2014/0303452 A1 | 10/2014 | Ghaffari |
| 2014/0303680 A1 | 10/2014 | Donnelly |
| 2014/0308930 A1 | 10/2014 | Tran |
| 2014/0340857 A1 | 11/2014 | Hsu |
| 2014/0350883 A1 | 11/2014 | Carter |
| 2014/0371547 A1 | 12/2014 | Gutenberg |
| 2014/0374872 A1 | 12/2014 | Rogers |
| 2014/0375465 A1 | 12/2014 | Fenuccio |
| 2015/0001462 A1 | 1/2015 | Rogers |
| 2015/0019135 A1 | 1/2015 | Kacyvenski |
| 2015/0025394 A1 | 1/2015 | Hong |
| 2015/0035680 A1 | 2/2015 | Li |
| 2015/0035743 A1 | 2/2015 | Rosener |
| 2015/0069617 A1 | 3/2015 | Arora |
| 2015/0099976 A1 | 4/2015 | Ghaffari |
| 2015/0100135 A1 | 4/2015 | Ives |
| 2015/0164377 A1 | 6/2015 | Nathan |
| 2015/0181700 A1 | 6/2015 | Rogers |
| 2015/0194817 A1 | 7/2015 | Lee |
| 2015/0237711 A1 | 8/2015 | Rogers |
| 2015/0241288 A1 | 8/2015 | Keen |
| 2015/0248833 A1 | 9/2015 | Arne |
| 2015/0260713 A1 | 9/2015 | Ghaffari |
| 2015/0272652 A1 | 10/2015 | Ghaffari |
| 2015/0286913 A1 | 10/2015 | Fastert |
| 2015/0320472 A1 | 11/2015 | Ghaffari |
| 2015/0335254 A1 | 11/2015 | Fastert |
| 2015/0342036 A1 | 11/2015 | Elolampi |
| 2016/0015962 A1 | 1/2016 | Shokoueinejad Maragheh |
| 2016/0027834 A1 | 1/2016 | de Graff |
| 2016/0045162 A1 | 2/2016 | De Graff |
| 2016/0081192 A1 | 3/2016 | Hsu |
| 2016/0086909 A1 | 3/2016 | Garlock |
| 2016/0095652 A1 | 4/2016 | Lee |
| 2016/0099214 A1 | 4/2016 | Dalal |
| 2016/0099227 A1 | 4/2016 | Dalal |
| 2016/0111353 A1 | 4/2016 | Rafferty |
| 2016/0135740 A1 | 5/2016 | Ghaffari |
| 2016/0178251 A1 | 6/2016 | Johnson |
| 2016/0213262 A1 | 7/2016 | Ghaffari |
| 2016/0213424 A1 | 7/2016 | Ghaffari |
| 2016/0228640 A1 | 8/2016 | Pindado |
| 2016/0232807 A1 | 8/2016 | Ghaffari |
| 2016/0240061 A1 | 8/2016 | Li |
| 2016/0249174 A1 | 8/2016 | Patel |
| 2016/0256070 A1 | 9/2016 | Murphy |
| 2016/0284544 A1 | 9/2016 | Nuzzo |
| 2016/0287177 A1 | 10/2016 | Huppert |
| 2016/0293794 A1 | 10/2016 | Nuzzo |
| 2016/0309594 A1 | 10/2016 | Hsu |
| 2016/0322283 A1 | 11/2016 | McMahon |
| 2016/0338646 A1 | 11/2016 | Lee |
| 2016/0361015 A1 | 12/2016 | Wang |
| 2016/0371957 A1 | 12/2016 | Ghaffari |
| 2016/0381789 A1 | 12/2016 | Rogers |
| 2017/0019988 A1 | 1/2017 | McGrane |
| 2017/0049397 A1 | 2/2017 | Sun |
| 2017/0071491 A1 | 3/2017 | Litt |
| 2017/0079588 A1 | 3/2017 | Ghaffari |
| 2017/0079589 A1 | 3/2017 | Ghaffari |
| 2017/0083312 A1 | 3/2017 | Pindado |
| 2017/0086747 A1 | 3/2017 | Ghaffari |
| 2017/0086748 A1 | 3/2017 | Ghaffari |
| 2017/0086749 A1 | 3/2017 | Ghaffari |

(56) References Cited

U.S. PATENT DOCUMENTS

| | | | |
|---|---|---|---|
| 2017/0095670 A1 | 4/2017 | Ghaffari | |
| 2017/0095732 A1 | 4/2017 | Ghaffari | |

FOREIGN PATENT DOCUMENTS

| | | | |
|---|---|---|---|
| CN | 102113089 A | 6/2011 | |
| CN | 202068986 U | 12/2011 | |
| DE | 10 2007 046 886 A1 | 4/2009 | |
| EP | 0585670 A2 | 3/1994 | |
| EP | 0779059 A1 | 6/1997 | |
| EP | 1808124 A2 | 7/2007 | |
| EP | 2259062 A2 | 12/2010 | |
| JP | 05-087511 A | 4/1993 | |
| JP | 2005-052212 A | 3/2005 | |
| JP | 2005108942 | 4/2005 | |
| JP | 2007294724 | 11/2007 | |
| JP | 2008244473 | 10/2008 | |
| JP | 2009-170173 A | 7/2009 | |
| JP | 2011517370 | 6/2011 | |
| JP | 2011176112 | 9/2011 | |
| JP | 2012023237 | 2/2012 | |
| WO | WO 1999/038211 A2 | 7/1999 | |
| WO | WO 2003/021679 A2 | 3/2003 | |
| WO | WO 2005/083546 A1 | 9/2005 | |
| WO | WO 2005/122285 A2 | 12/2005 | |
| WO | WO 2007/003019 A2 | 1/2007 | |
| WO | WO 2007/024983 A2 | 3/2007 | |
| WO | WO 2007/116344 A1 | 10/2007 | |
| WO | WO 2007/136726 A2 | 11/2007 | |
| WO | WO 2008/030960 A2 | 3/2008 | |
| WO | WO2008/056499 | 5/2008 | |
| WO | WO 2009/111641 A1 | 9/2009 | |
| WO | WO 2009/114689 A1 | 9/2009 | |
| WO | WO 2010/036807 A1 | 4/2010 | |
| WO | WO 2010/042653 A1 | 4/2010 | |
| WO | WO 2010/042957 A2 | 4/2010 | |
| WO | WO 2010/046883 A1 | 4/2010 | |
| WO | WO 2010/056857 A2 | 5/2010 | |
| WO | WO 2010/081137 A2 | 7/2010 | |
| WO | WO 2010/082993 A2 | 7/2010 | |
| WO | WO 2010/102310 A2 | 9/2010 | |
| WO | WO 2010/132552 A1 | 11/2010 | |
| WO | WO 2011/003181 A1 | 1/2011 | |
| WO | WO 2011/041727 A1 | 4/2011 | |
| WO | WO 2011/084450 A1 | 7/2011 | |
| WO | WO 2011/084709 A2 | 7/2011 | |
| WO | WO 2011/124898 A1 | 10/2011 | |
| WO | WO 2011/127331 A2 | 10/2011 | |
| WO | WO 2012/125494 A2 | 9/2012 | |
| WO | WO 2012/166686 A2 | 12/2012 | |
| WO | WO 2013/010171 A1 | 1/2013 | |
| WO | WO 2013/022853 A1 | 2/2013 | |
| WO | WO 2013/033724 A1 | 3/2013 | |
| WO | WO 2013/034987 A3 | 3/2013 | |
| WO | WO 2013/049716 A1 | 4/2013 | |
| WO | WO 2013/052919 A2 | 4/2013 | |
| WO | WO 2013/144738 A2 | 10/2013 | |
| WO | WO 2013/170032 A2 | 11/2013 | |
| WO | WO 2014/007871 A1 | 1/2014 | |
| WO | WO 2014/058473 A1 | 4/2014 | |
| WO | WO 2014/059032 A1 | 4/2014 | |
| WO | WO 2014/106041 A1 | 7/2014 | |
| WO | WO 2014/110176 A1 | 7/2014 | |
| WO | WO 2014/124044 A1 | 8/2014 | |
| WO | WO 2014/124049 A2 | 8/2014 | |
| WO | WO 2014/130928 A2 | 8/2014 | |
| WO | WO 2014/130931 A1 | 8/2014 | |
| WO | WO 2014/186467 A2 | 11/2014 | |
| WO | WO 2014/197443 A1 | 12/2014 | |
| WO | WO 2014/205434 A2 | 12/2014 | |
| WO | WO 2015/021039 A1 | 2/2015 | |
| WO | WO 2015/054312 A1 | 4/2015 | |
| WO | WO 2015/077559 A1 | 5/2015 | |
| WO | WO 2015/080991 A1 | 6/2015 | |
| WO | WO 2015/102951 A2 | 7/2015 | |
| WO | WO 2015/103483 A1 | 7/2015 | |
| WO | WO 2015/103580 A2 | 7/2015 | |
| WO | WO 2015/127458 A1 | 8/2015 | |
| WO | WO 2015/134588 A1 | 9/2015 | |
| WO | WO 2015/138712 A1 | 9/2015 | |
| WO | WO 2015/145471 A1 | 10/2015 | |
| WO | WO 2016/048888 A1 | 3/2016 | |
| WO | WO 2016/054512 A1 | 4/2016 | |
| WO | WO 2016/057318 A1 | 4/2016 | |
| WO | WO 2016/081244 A1 | 5/2016 | |
| WO | WO 2016/0127050 A1 | 8/2016 | |
| WO | WO 2016/134306 A1 | 8/2016 | |
| WO | WO 2016-140961 A1 | 9/2016 | |
| WO | WO 2016/205385 A1 | 12/2016 | |
| WO | WO 2017/015000 A1 | 1/2017 | |

OTHER PUBLICATIONS

Demura et al., "Immobilization of Glucose Oxidase with *Bombyx mori* Silk Fibroin by Only Stretching Treatment and its Application to Glucose Sensor," Biotechnology and Bioengineering, vol. 33, 598-603 (6 pages) (1989).

Ellerbee et al., "Quantifying Colorimetric Assays in Paper-Based Microfluidic Devices by Measuring the Transmission of Light through Paper," Analytical Chemistry, vol. 81, No. 20 8447-8452, (6 pages) (Oct. 15, 2009).

Halsted, "Ligature and Suture Material," Journal of the American Medical Association, vol. LX, No. 15, 1119-1126, (8 pages) (Apr. 12, 1913).

Kim et al., "Complementary Metal Oxide Silicon Integrated Circuits Incorporating Monolithically Integrated Stretchable Wavy Interconnects," Applied Physics Letters, vol. 93, 044102-044102.3 (3 pages) (Jul. 31, 2008).

Kim et al., "Dissolvable Films of Silk Fibroin for Ultrathin Conformal Bio-Integrated Electronics," Nature, 1-8 (8 pages) (Apr. 18, 2010).

Kim et al., "Materials and Noncoplanar Mesh Designs for Integrated Circuits with Linear Elastic Responses to Extreme Mechanical Deformations," PNAS, vol. 105, No. 48, 18675-18680 (6 pages) (Dec. 2, 2008).

Kim et al., "Stretchable and Foldable Silicon Integrated Circuits," Science, vol. 320, 507-511 (5 pages) (Apr. 25, 2008).

Kim et al., "Electrowetting on Paper for Electronic Paper Display," ACS Applied Materials & Interfaces, vol. 2, No. 11, (3318-3323) (6 pages) (Nov. 24, 2010).

Ko et al., "A Hemispherical Electronic Eye Camera Based on Compressible Silicon Optoelectronics," Nature, vol. 454, 748-753 (6 pages) (Aug. 7, 2008).

Lawrence et al., "Bioactive Silk Protein Biomaterial Systems for Optical Devices," Biomacromolecules, vol. 9, 1214-1220 (7 pages) (Nov. 4, 2008).

Meitl et al., "Transfer Printing by Kinetic Control of Adhesion to an Elastomeric Stamp," Nature, vol. 5, 33-38 (6 pages) (Jan. 2006).

Omenetto er al., "A New Route for Silk," Nature Photonics, vol. 2, 641-643 (3 pages) (Nov. 2008).

Omenetto er al., "New Opportunities for an Ancient Material," Science, vol. 329, 528-531 (5 pages) (Jul. 30, 2010).

Siegel et al., "Foldable Printed Circuit Boards on Paper Substrates," Advanced Functional Materials, vol. 20, No. 1, 28-35, (8 pages) (Jan. 8, 2010).

Tsukada et al., "Structural Changes of Silk Fibroin Membranes Induced by Immersion in Methanol Aqueous Solutions," Journal of Polymer Science, vol. 32, 961-968 (8 pages) (1994).

Wang et al., "Controlled Release From Multilayer Silk Biomaterial Coatings to Modulate Vascular Cell Responses" Biomaterials, 29, 894-903 (10 pages) (Nov. 28, 2008)

Wikipedia, "Ball bonding" article [online]. Cited in PCT/US2015/051210 search report dated Mar. 1, 2016 with the following information "Jun. 15, 2011 [retrieved on Nov. 11, 2015}. Retrieved 12-18, 29 from the Internet: <URL: https://webarchive.org/web/20110615221003/hltp://en.wikipedia.og/wiki/Ball_bonding>., entire document, especially para 1, 4, 5, 6,"2 pages, last page says ("last modified on May 11, 2011").

(56) References Cited

OTHER PUBLICATIONS

Bossuyt et al., "Stretchable Electronics Technology for Large Area Applications: Fabrication and Mechanical Characterizations", vol. 3, pp. 229-235 (7 pages) (Feb. 2013).
Jones et al., "Stretchable Interconnects for Elastic Electronic Surfaces". vol. 93, pp. 1459-1467 (9 pages) (Aug. 2005)
Lin et al., "Design and Fabrication of Large-Area, Redundant, Stretchable Interconnect Meshes Using Excimer Laser Photoablation and In Situ Masking", (10 pages) (Aug. 2010).
Kim et al., "A Biaxial Stretchable Interconnect With Liquid-Alloy-Covered Joints on Elastomeric Substrate", vol. 18, pp. 138-146 (9 pages) (Feb. 2009).

* cited by examiner

EMBEDDING THIN CHIPS IN POLYMER

CROSS-REFERENCES TO RELATED APPLICATIONS

This application is a continuation of U.S. patent application Ser. No. 14/859,112, filed Sep. 18, 2015, now U.S. Pat. No. 9,583,428, which is a continuation of U.S. patent application Ser. No. 13/844,638, filed Mar. 15, 2013, now U.S. Pat. No. 9,171,794, which claims priority to and the benefits of U.S. provisional application Ser. No. 61/711,629, filed Oct. 9, 2012, entitled "Embedding Thinned Chips and Interconnects in Flex Polymer," each of which are hereby incorporated by reference herein in their entireties, including drawings.

BACKGROUND

Traditional integrated circuit (IC) chips are generally thick and rigid. In addition, they are mounted on printed circuit boards (PCBs) that are as thick, if not thicker, than the chips and similarly rigid. Such processing using thick printed circuit boards are generally incompatible with chips that are thinned or have stretchable interconnects.

SUMMARY

Many schemes have been proposed for embedding chips on PCBs in flexible polymers. Most of these schemes are based on an assumption that the chips are considerably thicker than the layers of the flexible polymer that makes up the PCBs. Such schemes are not compatible for thinner chips.

In view of the foregoing, various examples described herein are directed generally to methods for embedding thin device islands, including IC chips, and/or stretchable interconnects in a flexible polymer. Various examples described herein are also directed generally to apparatus and systems based on thin device islands, including IC chips, and/or stretchable interconnects embedded in flexible polymer.

According to the principles disclosed herein, an apparatus can include a substrate comprising a standoff well region. The substrate can include a layer of a first conductive material disposed on a layer of a flexible polymer, and a patterned portion of the first conductive material comprises a standoff bordering a portion of exposed flexible polymer, thereby forming the standoff well region. The apparatus can also include a thin chip disposed within the standoff well region on a portion of the exposed flexible polymer proximate to the standoff. The height of the standoff can be comparable to a height of the thin chip.

In an example, the apparatus can include an adhesive material disposed within the standoff well region at a portion of the exposed flexible polymer proximate to the standoff. The thin chip can be disposed on the adhesive material proximate to the standoff. The adhesive material can have a thickness of about 8 μm, about 10 μm, about 12 μm, about 15 μm, about 20 μm, about 25 μm, or about 30 μm. In some examples, the adhesive material comprises a conductive adhesive or a non-conductive adhesive.

In an example, the patterned portion of the first conductive material can be formed using laser ablation or etching. The flexible polymer can be a polyimide or a liquid crystal polymer.

In an example, the first conductive material includes copper, gold, aluminum, or some combination thereof. The substrate can be a copper-clad polyimide.

In certain examples, the layer of flexible polymer can have a thickness of about 8 μm, about 10 μm, about 15 μm, about 25 μm, about 35 μm, about 50 μm, about 60 μm, about 75 μm, or about 85 μm, and the layer of first conductive material can have a thickness of about 2 μm, about 5 μm, about 8 μm, about 12 μm, about 15 μm, about 25 μm, about 35 μm, about 50 μm, about 60 μm, or about 70 μm. In an example, the thin chip can have a thickness of about 2 μm, about 5 μm, about 8 μm, about 12 μm, about 15 μm, about 25 μm, about 35 μm, about 50 μm, about 60 μm, or about 70 μm.

In an example, the thin chip can be a thinned chip. The thinned chip can be formed from a chip that can be thinned using an etching process or a grinding process. In an example, the thin chip can be disposed within the standoff well region such that the height of the standoff can be greater than or about equal to the height of the thin chip. In another example, the thin chip can be disposed within the standoff well region such that the height of the standoff can be less than the height of the thin chip.

In an example, the thin chip can have a layer of first conductive material can have a thickness of about 2 μm, about 5 μm, about 8 μmin, about 12 μm, about 15 μm, about 25 μm, about 35 μm, about 50 μm, about 60 μm, or about 70 μm.

In one example, the apparatus can also include a polymer sheet disposed over the substrate. At least one via can be formed through the polymer sheet. The apparatus can also include a second conductive material disposed on a portion of the polymer sheet proximate to the at least one via, such that the second conductive material forms an electrical communication with an electrical contact of the thin chip.

In an example, the second conductive material can include titanium, tungsten, gold, nickel, chromium, or some combination thereof.

In an example, the standoff surrounds a portion of the thin chip. In another example, the standoff can completely surrounds the thin chip. In one example, a dielectric material can be disposed between the standoff and a portion of the thin chip.

In an example, at least one additional layer can be disposed on the first conductive material or on the flexible polymer, wherein the at least one additional layer positions the thin chip at a neutral mechanical plane of the apparatus.

According to the principles disclosed herein, a method for embedding thin chips can include providing a substrate comprising a standoff well region, wherein the substrate includes a layer of a first conductive material disposed on a layer of a flexible polymer. The substrate can also include at least a portion of the first conductive material can be patterned to form a standoff bordering a portion of exposed flexible polymer, thereby forming the standoff well region. The method can also include disposing a thin chip on a portion of the exposed flexible polymer proximate to the standoff such that a height of the standoff can be comparable to a height of the thin chip.

In an example, the method can also include disposing an adhesive material on a portion of the exposed flexible polymer proximate to the standoff, and disposing the thin chip on the adhesive material disposed on the portion of the exposed flexible polymer proximate to the standoff.

In some examples, the height of the standoff can be greater than or about equal to a height of a thin chip.

In certain examples, the disposing step can also include disposing the thin chip on a portion of the flexible polymer proximate to the standoff such that the height of the standoff can be greater than or about equal to the height of the thin chip.

In an example, the thin chip can be a thinned chip, and the thinning a chip can be provided by an etching process or a grinding process. The thinned chip can be disposed on a portion of the exposed flexible polymer proximate to the standoff such that a height of the standoff can be comparable to a height of the thinned chip.

In an example, the method can also include disposing a polymer sheet over the substrate and forming at least one via through the polymer sheet. The method can further include disposing a conductive material on a portion of the second polymer sheet proximate to the at least one via, such that the conductive material forms an electrical communication with an electrical contact of the thin chip.

In an example, the method can further include disposing at least one additional layer on the first conductive material or on the flexible polymer, wherein the at least one additional layer positions the thin chip at a neutral mechanical plane of the apparatus.

According to the principles disclosed herein, an apparatus can include a substrate with a polymer well region. The substrate can include a layer of a flexible polymer disposed on a layer of a first conductive material. The substrate can also include a cavity in at least a portion of the flexible polymer to form at least one polymer wall bordering a portion of exposed first conductive material, thereby forming the polymer well region. The apparatus can also include a thin chip disposed within the polymer well region on at least a portion of the exposed first conductive material proximate to the at least one polymer wall.

In an example, the apparatus can also include an adhesive material disposed within the polymer well region on at least a portion of the exposed first conductive material proximate to the at least one polymer wall, wherein the thin chip can be disposed on the adhesive material proximate to the at least one polymer wall.

In an example, the adhesive material can have a thickness of about 8 μm, about 10 μm, about 12 μm, about 15 μm, about 20 μm, about 25 μm, or about 30 μm. The adhesive material can include a conductive adhesive or a non-conductive adhesive.

In an example, the cavity can be formed using laser ablation or etching. The flexible polymer can be a polyimide or a liquid crystal polymer. The first conductive material can include copper, gold, aluminum, or some combination thereof. The substrate can include a copper-clad polyimide.

In an example, the layer of flexible polymer can have a thickness of about 8 μm, about 10 μm, about 15 μm, about 25 μm, about 35 μm, about 50 μm, about 60 μm, about 75 μm, or about 85 μm. The layer of first conductive material can have a thickness of about 2 μm, about 5 μm, about 8 μm, about 12 μm, about 15 μm, about 25 μm, about 35 μm, about 50 μm, about 60 μm, or about 70 μm. The thin chip can have a thickness of about 2 μm, about 5 μm, about 8 μm, about 12 μm, about 15 μm, about 25 μm, about 35 μm, about 50 μm, about 60 μm, or about 70 μm.

In an example, the thin chip can be a thinned chip. The thinned chip can be formed from a chip that can be thinned using an etching process or a grinding process. The thin chip can be disposed within the polymer well region such that the height of the at least one polymer wall can be greater than or about equal to the height of the thin chip. In an example, the thin chip can be disposed within the polymer well region such that the height of the at least one polymer wall can be less than the height of the thin chip.

In an example, the thin chip can have a layer of first conductive material can have a thickness of about 2 μm, about 5 μm, about 8 μm, about 12 μm, about 15 μm, about 25 μm, about 35 μm, about 50 μm, about 60 μm, or about 70 μm.

In an example, the apparatus can also include a polymer sheet disposed over the substrate. The apparatus can further include at least one via formed through the polymer sheet, and a second conductive material disposed on a portion of the polymer sheet proximate to the at least one via, such that the second conductive material forms an electrical communication with an electrical contact of the thin chip.

In an example, the second conductive material can include titanium, tungsten, gold, nickel, chromium, or some combination thereof.

In an example, the at least one polymer wall can surround a portion of the thin chip. The at least one polymer wall can completely surround the thin chip in another example.

In an example, a dielectric material can be disposed between the at least one polymer wall and a portion of the thin chip. The apparatus can further include at least one additional layer disposed on the first conductive material or on the flexible polymer, wherein the at least one additional layer positions the thin chip at a neutral mechanical plane of the apparatus.

In an example, the thin chip can be a thinned chip, and the thin chip can be thinned using an etching process or a grinding process, and disposed within the polymer well region on at least a portion of the exposed first conductive material proximate to the at least one polymer wall such that a height of the least one wall can be comparable to a height of the thinned chip.

According to the principles described herein, a method for embedding thin chips can include providing a substrate comprising a polymer well region, the substrate comprising a layer of a flexible polymer and a layer of a first conductive material, the polymer well region comprising at least one polymer wall formed from a portion of the flexible polymer and a base region formed from at least a portion of the first conductive material, and disposing the thin chip within the polymer well region on a portion of the first conductive material proximate to the at least one polymer wall.

In an example, the method can also include disposing an adhesive material at the portion of the first conductive proximate to the at least one polymer wall, and disposing the thin chip on the adhesive material proximate to the at least one polymer wall.

In an example, the thin chip can be disposed within the polymer well region such that the height of the at least one polymer wall can be greater than or about equal to the height of the thin chip. In another example, the thin chip can be disposed within the polymer well region such that the height of the at least one polymer wall can be less than the height of the thin chip. In yet another example, thin chip can be disposed within the polymer well region such that the first conductive material can be in physical and electrical communication with the thin chip.

In an example, the method can further include disposing a polymer sheet over the substrate, forming at least one via through the polymer sheet, and disposing a second conductive material on a portion of the polymer sheet proximate to the at least one via, such that the second conductive material forms an electrical communication with an electrical contact of the thin chip.

In another example, the method can further include disposing at least one additional layer disposed on the first conductive material or on the flexible polymer, wherein the at least one additional layer positions the thin chip at a neutral mechanical plane of the apparatus.

According to the principled disclosed herein, an apparatus can include a flexible substrate including a well region. The flexible substrate can include a polyimide or a liquid crystal polymer, and the flexible substrate can include a cavity forming a well region in the flexible substrate. The apparatus can also include a thin chip disposed within the well region, wherein the height of at least one polymer wall of the well region can be comparable to a height of the thin chip. The apparatus can further include a polymer adhesive material disposed in the well region in substantial contact with at least a portion of the thin chip.

In an example, the apparatus can also include a polymer sheet disposed over the flexible substrate and at least one via formed through the polymer sheet. The apparatus can also include a conductive material disposed on a portion of the polymer sheet proximate to the at least one via, such that the second conductive material forms an electrical communication with an electrical contact of the thin chip.

In an example, the apparatus can also include at least one via formed through the polymer adhesive material, and a conductive material disposed on a portion of the polymer adhesive material proximate to the at least one via, such that the conductive material forms an electrical communication with an electrical contact of the thin chip.

In an example, an adhesive material can be disposed within the well region, wherein the thin chip can be disposed on the adhesive material.

In another example, the thin chip can be disposed within the well region such that the height of the at least one polymer wall can be greater than or about equal to the height of the thin chip. The thin chip can be disposed within the well region such that the height of the at least one polymer wall can be less than the height of the thin chip. In an example, a dielectric material can be disposed between the at least one polymer wall and a portion of the thin chip.

The following publications, patents, and patent applications are hereby incorporated herein by reference in their entirety:

Kim et al., "Stretchable and Foldable Silicon Integrated Circuits," Science Express, Mar. 27, 2008, 10.1126/science.1154367;

Ko et al., "A Hemispherical Electronic Eye Camera Based on Compressible Silicon Optoelectronics," Nature, Aug. 7, 2008, vol. 454, pp. 748-753;

Kim et al., "Complementary Metal Oxide Silicon Integrated Circuits Incorporating Monolithically Integrated Stretchable Wavy Interconnects," Applied Physics Letters, Jul. 31, 2008, vol. 93, 044102;

Kim et al., "Materials and Noncoplanar Mesh Designs for Integrated Circuits with Linear Elastic Responses to Extreme Mechanical Deformations," PNAS, Dec. 2, 2008, vol. 105, no. 48, pp. 18675-18680;

Meitl et al., "Transfer Printing by Kinetic Control of Adhesion to an Elastomeric Stamp," Nature Materials, January, 2006, vol. 5, pp. 33-38;

U.S. Patent Application publication no. 2010 0002402-A1, published Jan. 7, 2010, filed Mar. 5, 2009, and entitled "STRETCHABLE AND FOLDABLE ELECTRONIC DEVICES;"

U.S. Patent Application publication no. 2010 0087782-A1, published Apr. 8, 2010, filed Oct. 7, 2009, and entitled "CATHETER BALLOON HAVING STRETCHABLE INTEGRATED CIRCUITRY AND SENSOR ARRAY;"

U.S. Patent Application publication no. 2010 0116526-A1, published May 13, 2010, filed Nov. 12, 2009, and entitled "EXTREMELY STRETCHABLE ELECTRONICS;"

U.S. Patent Application publication no. 2010 0178722-A1, published Jul. 15, 2010, filed Jan. 12, 2010, and entitled "METHODS AND APPLICATIONS OF NON-PLANAR IMAGING ARRAYS;" and U.S. Patent Application publication no. 2010 027119-A1, published Oct. 28, 2010, filed Nov. 24, 2009, and entitled "SYSTEMS, DEVICES, AND METHODS UTILIZING STRETCHABLE ELECTRONICS TO MEASURE TIRE OR ROAD SURFACE CONDITIONS."

Kim, D. H. et al. (2010). Dissolvable films of silk fibroin for ultrathin conformal bio-integrated electronics. *Nature Materials*, 9, 511-517.

Omenetto, F. G. and D. L. Kaplan. (2008). A new route for silk. *Nature Photonics*, 2, 641-643.

Omenetto, F. G., Kaplan, D. L. (2010). New opportunities for an ancient material. *Science*, 329, 528-531.

Halsed, W. S. (1913). Ligature and suture material. *Journal of the American Medical Association*, 60, 1119-1126.

Masuhiro, T., Yoko, G., Masaobu, N., et al. (1994). Structural changes of silk fibroin membranes induced by immersion in methanol aqueous solutions. *Journal of Polymer Science*, 5, 961-968.

Lawrence, B. D., Cronin-Golomb, M., Georgakoudi, I., et al. (2008). Bioactive silk protein biomaterial systems for optical devices. *Biomacromolecules*, 9, 1214-1220.

Demura, M., Asakura, T. (1989). Immobilization of glucose oxidase with *Bombyx mori* silk fibroin by only stretching treatment and its application to glucose sensor. *Biotechnology and Bioengineering*, 33, 598-603.

Wang, X., Zhang, X., Castellot, J. et al. (2008). Controlled release from multilayer silk biomaterial coatings to modulate vascular cell responses. *Biomaterials.* 29, 894-903.

U.S. patent application Ser. No. 12/723,475 entitled "SYSTEMS, METHODS, AND DEVICES FOR SENSING AND TREATMENT HAVING STRETCHABLE INTEGRATED CIRCUITRY," filed Mar. 12, 2010.

U.S. patent application Ser. No. 12/686,076 entitled "Methods and Applications of Non-Planar Imaging Arrays," filed Jan. 12, 2010.

U.S. patent application Ser. No. 12/636,071 entitled "Systems, Methods, and Devices Using Stretchable or Flexible Electronics for Medical Applications," filed Dec. 11, 2009.

U.S. Patent Application publication no 2012-0065937-A1, published Mar. 15, 2012, and entitled "METHODS AND APPARATUS FOR MEASURING TECHNICAL PARAMETERS OF EQUIPMENT, TOOLS AND COMPONENTS VIA CONFORMAL ELECTRONICS."

U.S. patent application Ser. No. 12/616,922 entitled "Extremely Stretchable Electronics," filed Nov. 12, 2009.

U.S. patent application Ser. No. 12/575,008 entitled "Catheter Balloon Having Stretchable Integrated Circuitry and Sensor Array," filed on Oct. 7, 2009.

U.S. patent application Ser. No. 13/336,518 entitled "Systems, Methods, and Devices Having Stretchable Integrated Circuitry for Sensing and Delivering Therapy," filed Dec. 23, 2011.

It should be appreciated that all combinations of the foregoing concepts and additional concepts described in greater detail below (provided such concepts are not mutually inconsistent) are contemplated as being part of the inventive subject matter disclosed herein. It also should be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the figures, described herein, are for illustration purposes only, and that the drawings are not intended to limit the scope of the disclosed teachings in any way. In some instances, various aspects or features may be shown exaggerated or enlarged to facilitate an understanding of the inventive concepts disclosed herein (the drawings are not necessarily to scale, emphasis instead being placed upon illustrating the principles of the teachings). In the drawings, like reference characters generally refer to like features, functionally similar and/or structurally similar elements throughout the various figures.

DETAILED DESCRIPTION

Figure 1:
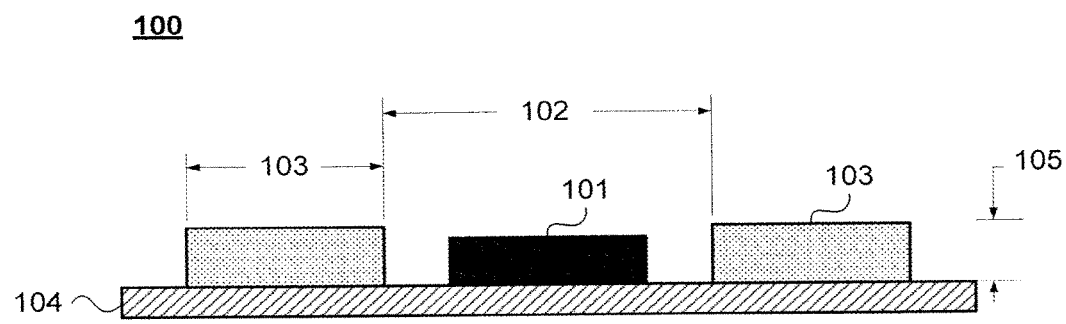
FIG. 1 shows a cross sectional view of an example apparatus that includes a thin chip disposed in a well region, according to the principles described herein.

Following below are more detailed descriptions of various concepts related to, and embodiments of, an apparatus and systems for embedding thinned chips in a flexible polymer. It should be appreciated that various concepts introduced above and described in greater detail below may be implemented in any of numerous ways, as the disclosed concepts are not limited to any particular manner of implementation. Examples of specific implementations and applications are provided primarily for illustrative purposes.

As used herein, the term "includes" means includes but is not limited to, the term "including" means including but not limited to. The term "based on" means based at least in part on. As used herein, the term "disposed on" or "disposed above" is defined to encompass "at least partially embedded in."

With respect to substrates or other surfaces described herein in connection with various examples of the principles herein, any references to "top" surface and "bottom" surface are used primarily to indicate relative position, alignment and/or orientation of various elements/components with respect to the substrate and each other, and these terms do not necessarily indicate any particular frame of reference (e.g., a gravitational frame of reference). Thus, reference to a "bottom" of a substrate or a layer does not necessarily require that the indicated surface or layer be facing a ground surface. Similarly, terms such as "over," "under," "above," "beneath" and the like do not necessarily indicate any particular frame of reference, such as a gravitational frame of reference, but rather are used primarily to indicate relative position, alignment and/or orientation of various elements/components with respect to the substrate (or other surface) and each other. The terms "disposed on" "disposed in" and "disposed over" encompass the meaning of "embedded in," including "partially embedded in." In addition, reference to feature A being "disposed on," "disposed between," or "disposed over" feature B encompasses examples where feature A is in contact with feature B, as well as examples where other layers and/or other components are positioned between feature A and feature B.

A system, apparatus and method described herein provides for embedding chips in well regions. The well region can be generated as a standoff well region or a polymer well region, as described herein.

Herein, a "thin chip" refers to chips or other device islands that are formed to have thicknesses of about 5 microns, about 8 microns, about 10 microns or more, or that have been thinned to thicknesses of about 5 microns, about 8 microns, about 10 microns or more. In various examples, the chips (or other device islands) can be fabricated as thin as (or be thinned to) about 5 microns, about 8 microns, about 15 microns, about 20 microns, about 25 microns, 30 microns, 37.5 microns, 42 microns, 50 microns or more.

An example standoff well region according to the principles described herein can be formed in a substrate that includes a layer of a conductive material disposed on a layer of a flexible polymer. Portion of the conductive material can be patterned to create standoffs bordering a portion of exposed flexible polymer, forming the standoff well region. According to the principles described herein, a thin chip can be disposed within the standoff well region on a portion of the exposed flexible polymer proximate to the standoff. Based on the thickness of the thin chips herein, the height of the standoff is comparable to the height of the thin chip.

In a non-limiting example, an adhesive can be disposed on the exposed portion of the flexible polymer prior to the thin chip being disposed in the standoff well region. The adhesive can be a non-conductive (dielectric) adhesive that is configured to withstand the temperatures of further processing.

In various examples, further processing can be performed on the apparatus including the thin chip disposed in the standoff well region. For example, an additional adhesive can be disposed over the thin chip to fill the void between the thin chip and the standoff of the standoff well region. As another example, at least one additional sheet of a flexible polymer can be disposed on the apparatus or vias can be generated to establish an electrical communication with the thin chip, as described in greater detail below.

The principles described herein can be applied to rigid or flexible printed circuit boards. The printed circuit boards are referred to herein as flex and/or PCB. As a non-limiting example, a PCB board or flex sheet that includes a metal clad polymer sheet can be patterned, including being etched, to generate at least one standoff well region in the metal layer that extends down to the polymer. A thin chip is disposed in the standoff well region on the exposed portions of the polymer sheet of the flex board. An adhesive can be placed above the nestled chip and a second flex sheet is placed above the polymer. The sandwiched structure can be subjected to further processing to cause the adhesive to flow around at least a portion of the chip. At least one via can be formed through the top flex board down to the chip, and filled with a conductive material, to provide electrical communication with the bond pads of the thin chip.

An example polymer well region according to the principles described herein can be formed in a layer of flexible polymer disposed on a layer of a conductive material. A cavity can be formed in at least a portion of the flexible polymer to form the at least one polymer wall bordering a portion of the exposed first conductive material to form the polymer well region. A thin chip can be disposed in the polymer well region on at least a portion of the exposed first conductive material proximate to the at least one polymer wall.

In various examples, based on the thickness of the flexible polymer of the substrate or the depth from the surface to which the cavity extends into the flexible polymer, the height of the polymer wall may be comparable to the height of the thin chip. In other examples, the thin chip can be mounted in the polymer well region such that the level of the top surface of the thin chip is comparable to the top surface of the thin chip.

In a non-limiting example, an adhesive can be disposed on the exposed portion of the conductive material prior to the thin chip being disposed in the polymer well region. The adhesive can be a conductive adhesive or a non-conductive (dielectric) adhesive that is configured to withstand the temperatures of further processing. The conductive adhesive can be used to establish electrical communication between the conductive material of the substrate and conductive contact pads on the bottom surface of the thin chip.

In various example, further processing can be performed on the apparatus including the thin chip disposed in the polymer well region. For example, an additional adhesive can be disposed over the thin chip to fill the void between the thin chip and the polymer wall of the polymer well region.

In another example, at least one additional sheet of a flexible polymer can be disposed on the apparatus including the thin chip disposed in the polymer well region. Vias can be generated to establish an electrical communication with the thin chip, as described in greater detail below. In this example, the additional sheet of a flexible polymer can include a layer of a conductive material, and can be disposed on the apparatus such that the side that includes the conductive material layer is directed away from the thin chip. In this example, the conductive layer of the substrate and the conductive layer of the additional sheet would be located on the outside of the "sandwich" with the thin chip embedded within the sandwich. Vias can be generated through the conductive material layers and the flexible polymer layers as described herein to facilitate the electrical communication to the thin chip.

In an example system, apparatus and method, an embedded device formed according to the principles herein can be encapsulated using an encapsulant, such as but not limited to a polymer, to form an encapsulated device. The encapsulated device can be placed on the skin to perform a measurement or other diagnostic or therapeutic procedure. In an example, the embedded device and the encapsulated device are is configured to withstand deformation in more than one direction (for example, in x, y and/or z-directions), torsion, compression, expansion, or other change in conformation.

In an example use, the encapsulated structure can be placed on a surface, such as but not limited to skin or other tissue. In an example use, the encapsulated structure can be configured such that it conforms to a contour of the surface.

In various examples, the flexible polymer and/or the encapsulant can be formed from the same polymer or polymeric material or different polymers or polymeric materials. Non-limiting examples of applicable polymers or polymeric materials include, but are not limited to, a polyimide, a polyethylene terephthalate (PET), or a polyurethane. Other non-limiting examples of applicable polymers or polymeric materials include plastics, elastomers, thermoplastic elastomers, elastoplastics, thermostats, thermoplastics, acrylates, acetal polymers, biodegradable polymers, cellulosic polymers, fluoropolymers, nylons, polyacrylonitrile polymers, polyamide-imide polymers, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins, or any combinations of these materials. In an example, a polymer or polymeric material herein can be a DYMAX® polymer (Dymax Corporation, Torrington, Conn.). or other UV curable polymer.

In an example, a method of embedding chips inside rigid or flexible printed circuit boards (flex, PCB) is provided. The method can be used to embed chips and/or other components, including but not limited to light emitting diodes (LEDs) or interconnects, inside polymers or polymeric materials. The embedding process provides for protection of the embedded device against the environment and for connecting them to each other to form larger electronic circuits, including integrated electronic circuits.

The conductive material of any of the examples described herein can be but is not limited to a metal, a metal alloy, or other conductive material. In an example, the metal or metal alloy of the coating may include but is not limited to aluminum or a transition metal (including copper, silver, gold, platinum, zinc, nickel, titanium, chromium, or palladium, or any combination thereof) and any applicable metal alloy, including alloys with carbon. In other non-limiting example, suitable conductive materials may include a semiconductor-based conductive material, including a silicon-based conductive material, indium tin oxide or other transparent conductive oxide, or Group III-IV conductor (including GaAs).

In any example herein, the layer of flexible polymer can have a thickness of about 8 μm, about 10 μm, about 15 μm, about 25 μm, about 35 μm, about 50 μm, about 60 μm, about 75 μm, or about 85 μm.

In any example herein, the layer of conductive material can have a thickness of about 2 μm, about 5 μm, about 8 μm, about 12 μm, about 15 μm, about 25 μm, about 35 μm, about 50 μm, about 60 μm, or about 70 μm.

In any example herein, the thin chip can have a thickness of about 2 μm, about 5 μm, about 8 μm, about 12 μm, about 15 μm, about 25 μm, about 35 μm, about 50 μm, about 60 μm, or about 70 μm In any example herein, the adhesive material can have a thickness of about 8 μm, about 10 μm, about 12 μm, about 15 μm, about 20 μm, about 25 μm, or about 30 μm.

FIG. 1 is a cross sectional view of an example apparatus 100 that is formed from a thin chip 101 embedded in a well region 102. In this and any other example herein, the thin chip 101 can be a thinned chip. The well region 102 is formed from standoffs 103 bordering exposed portions of a flexible polymer 104. The standoff 103 forms a wall of the well region 102, thereby providing a standoff well region. In this example, the thin chip 101 is disposed on the exposed portions of the flexible polymer 104 proximate to a standoff 103. The standoff 103 can have a height 105 that is comparable to the height of the thin chip 101.

In the example systems, apparatus and methods described herein, the thin chip 101 can be one or more passive electronic components and/or active electronic components. Non-limiting examples of components that can be embedded according to any of the principles described herein include a transistor, an amplifier, a photodetector, a photodiode array, a display, a light-emitting device, a photovoltaic device, a sensor, a LED, a semiconductor laser array, an optical imaging system, a large-area electronic device, a logic gate array, a microprocessor, an integrated circuit, an electronic device, an optical device, an opto-electronic device, a mechanical device, a microelectromechanical device, a nanoelectromechanical device, a microfluidic device, a thermal device, or other device structures.

In an example, embedded devices according to the principles described herein can be formed by embedding a plurality of chips (or other device islands) and/or a plurality of the interconnects in the flexible polymer according to the principles herein. In an example, the embedded device (e.g., thin chip 101) can be formed from an integrated device, or formed from a plurality of chips (or other device islands) interconnected by a plurality of interconnects, that is embedded according to the principles herein.

The thin chip 101 (including an integrated device or device island as described herein) can be made thinner than the thickness of the conductive coating on the flexible polymer layer 104 from which the standoffs 103 of the standoff well region 102 is created. The conductive material coating can include, but is not limited to, metal traces or other metal coatings. The standoff well region 102 can be formed in the conductive coating through, e.g., patterning the conductive material coating on a flexible polymer and etching through to the surface of the flexible polymer 104. The etch process might include to the removal of some surface portion of the flexible polymer 104 as well. In another examples, the patterning may be performed with laser ablation or similar patterning process. After the conductive material coating on the polymer layer has been patterned and the standoff well region formed, the chip (including any device island) can be disposed and fixed between walls of the conductive coating "well," creating features above the polymer that are roughly the same height as the walls of the standoff well region. In other examples, the height of the standoff 105 can be greater than or less than the height of the thin chip 101.

In various examples, the standoff well 102 can be formed such that the positioned chip or other device island is shorter than or approximately equal to the well height 104. In other examples, the well 102 can be formed such that the positioned the thin chip 101 (including a device island and/or an interconnect) is taller than the height of the walls of the well. The standoffs 103 of the standoff well region 103 can be about 80%, about 90%, about 100%, about 110%, about 120%, about 140%, or about 150% of the thickness of the thin chip 101 (including a device island and/or interconnect). In other examples, the standoffs 103 of the standoff well region 103 can be about twice the thickness of the thin chip 101 or other device island and/or interconnect.

FIGS. 2A-2E show non-limiting examples of different conformations of the standoff well region. As illustrated, the standoff well region 102 (including the standoffs 103) can have a square shape, a rectangular shape, a rounded or other donut shape, or any other polygonal shape, such that a chip or other device island and/or interconnect can be disposed therein.

Figure 2A:
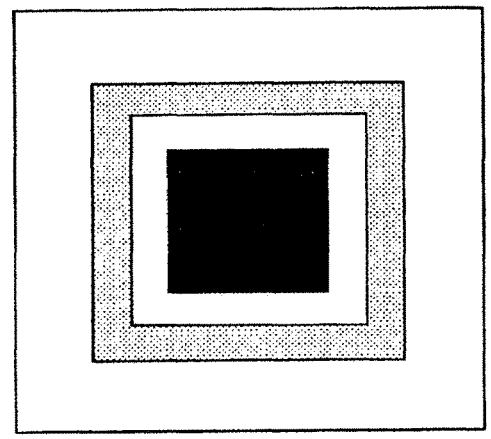
FIGS. 2A-2E show example configurations of well regions, according to the principles described herein.
Figure 2B:
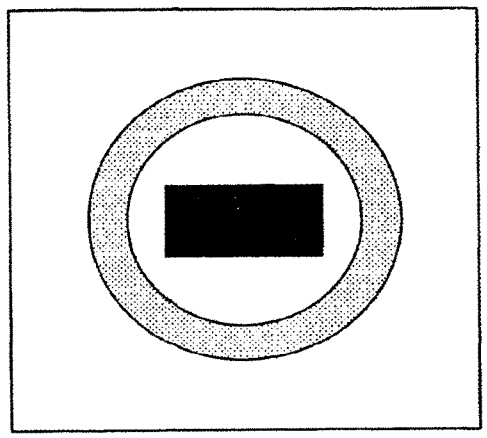
Figure 2C:
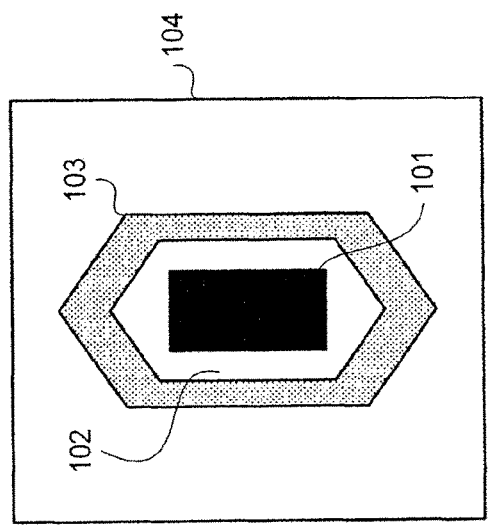
Figure 2E:
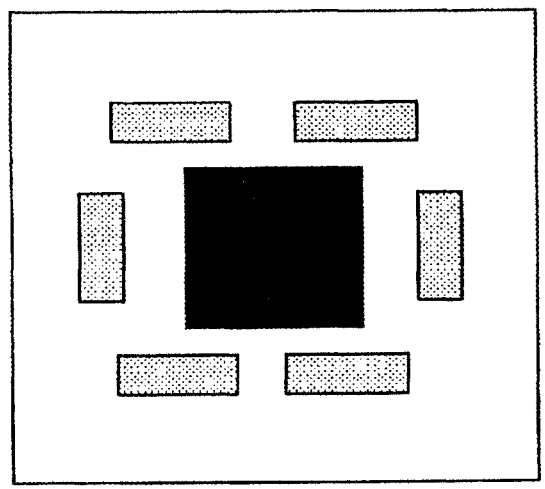
Figure 2D:
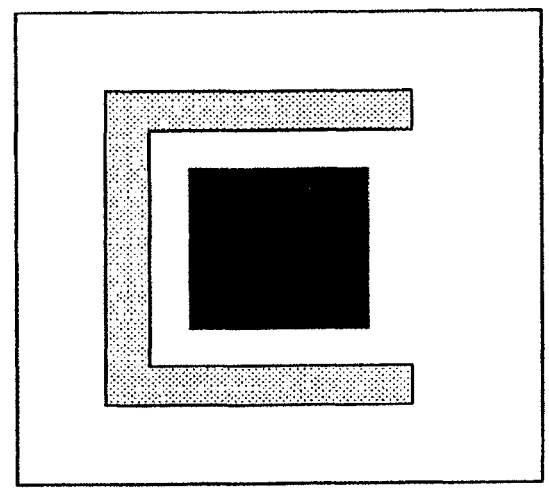

FIG. 2D shows a non-limiting example standoff well region (including the standoffs) that is fabricated to not completely surround the thin chip (including a device island and/or the interconnect). In this example, the standoff well region 102 borders three sides of the thin chip 101. In the non-limiting example of FIG. 2E, the standoff well region (including the standoffs) is fabricated to border portions of the sides of the thin chip 101 (including a device island and/or the interconnect, with some gaps in portions of the standoffs of the standoff well regions.

In some examples, and as described further in connection with FIG. 3, an adhesive can be caused to flow around the thin chip 101 (including any other device island and/or interconnect). For example, the adhesive can be caused to flow using a heat-treatment process. In an example, the heat-treatment process can be carried out at temperatures that vary from about 60° C. to about 250° C. The stacked layers, including the device islands and/or interconnects and any adhesive layer between the flexible polymer sheets, can be positioned between two metal plates and brought up to temperature to cause the adhesive to flow around the device islands and/or interconnects.

In an example, the embedded device is configured such that an embedded serpentine interconnect retains substantial range of motion and stretchability within the plane of the embedded device. In an example, the embedded device is configured such that an embedded serpentine interconnect retains substantial range of motion such that portions of it can rotate out of the plane to provide increased stretchability.

In an example process, metal traces, and accordingly the well wall height 105, can be typically 35 µm ("1 oz. copper"), 17.5 µm ("½ oz. copper"), 9 µm ("¼ oz. copper") or 5 µm. Printed circuit boards specify copper thickness in ounces. This represents the thickness of 1 ounce of copper rolled out to an area of 1 square foot. The thickness of 1 oz. of copper is 1.4 mils or 35.56 microns.

In an example, the thin chips 101 (including any other device islands and/or interconnects) can be thinned to about 25 µm to be more suitable for 1 oz. copper traces (which determines the height of the standoff s). In an example, the thin chips 101 (including any other device islands and/or interconnects) can be thinned to 10 µm to be suitable for ½ oz. copper traces (which determines the well wall or standoff height).

In an example, some margin can be left between the thin chip and the standoff for disposing an adhesion layer, which is either dispensed on the flexible polymer layer 104 prior to placement of the thin chip 101 (including any other device island and/or interconnects)), or which is pre-adhered to the thin chips (including any other device islands and/or interconnects) prior to being disposed in the standoff well region 102.

In an example, an additional layer of conductive material may be added to the metallization on the chip or other device island. Some amount of metallization is generally provided at selected portions of the thin chip 101 (including any other device island and/or interconnects) to facilitate creating an electrical contact to the functional capability of the thin chip (including any other device island and/or interconnects). This metallization can be about 1 µm to about 2 µm thick. In some examples, the metallization is made of aluminum. However, other materials can be used for the metallization, such as any other metal or metal alloy described hereinabove in connection with the conductive material. Laser drilling may be used to create channels through the flexible polymer and the adhesive material to create access to the metallization of the thin chip 101 or other device island within the embedded device structure. It can be difficult to control the laser drilling so that it stops at the metallization and does not remove the metallization or puncture the thin chip 101 or other device island. For example, about 5 μm thickness of copper may be needed to terminate the laser drilling without the risk of removing the metallization or puncture. Other techniques for creating the through channels, including etching, can present similar risks of damage to the thin chip 101 or other device island. The additional layer of conductive material added to the metallization on the thin chip 101 or other device island in this example provides extra thickness that can help to withstand the laser drilling. In an example, the additional layer of conductive material (such as but not limited to added metal or metal stacks) is selected to have properties such as but not limited to adherence to the metallization of the chip or other device island; possible to be added to a thickness of about 2 μm to about 7 μm; and/or the ability to support, and form an electrical communication with, the material that is electroplated into via, such as but not limited to a metal or metal alloy electroplating (including Cu electroplating). The additional layer of conductive material (such as but not limited to the added metal) can be patterned and etched to form the standoffs 103.

The additional layer of conductive material may be added to the metallization on the chip or other device island in a variety of ways. For example, an under-bump metallization (UBM) suitable for copper micro-pillars could be carried out, without following through with the usual bumps that would be added, to generate the additional layer of conductive material on the metallization. The UBM can be carried out based on, e.g., a multilayer chromium-copper system (Cr:Cr—Cu:Cu), titanium-nickel-vanadium system (Ti—Ni—V), titanium-copper system (Ti—Cu), titanium-tungsten-gold system (Ti—W—Au), or a nickel-gold system (Ni—Au). In another example, the additional layer of conductive material may be added using electroplating on to the chip (or other device island) pads, after deposition of one or more suitable seed layers. The electroplating can be caused to deposit only on the regions of the chip (or other device island) where the metallization exists. In another example, conductive material can be added to larger portions of the chip (or other device island) and can be patterned and selectively removed (e.g., by etching) to be present only in the regions of the thin chip 101 (or other device island) with the original metallization to provide the additional layer of conductive material.

In an example, an embedded device formed according to the principles herein can be patterned or sliced to remove a portion of the flexible polymer that does not enclose a portion of the chip (or other device island) and/or the interconnect. For example, the embedded device can be patterned along the outline and/or contour of the device structure that is embedded within the flexible polymer. According to any of these examples, the embedded device can be patterned along the outline and/or contour of a serpentine interconnect of the embedded device.

The example systems, apparatus and methods described herein exploit chips or other device islands that are thinner than the surrounding standoffs or well walls to embed the chips or other device islands between flex board layers. In a non-limiting example, the surrounding standoffs or well walls are formed from metal traces.

In an non-limiting example, the surrounding standoffs or well walls are formed from a process of writing an "ink" of conductive material, rather than from patterning and etching a coating layer. In an non-limiting example, the "ink" of conductive material can be written using an inkjet printer device or other device.

The example systems, apparatus and methods described herein provide for good adhesion of layers, conformability of embedding material around the chip or other device islands, elimination of air pockets, and prevention of ingress of liquids from the outside.

The example systems, apparatus and methods described herein provide for embedding thin chips or other device islands and/or stretchable interconnects to provide entire assemblies that are flexible. In an example, the embedded device formed in the flexible polymer can be cut or otherwise formed into serpentine traces that can cause the entire assembly circuit to become even become stretchable, and not merely just flexible.

The example embedded devices according to the systems, apparatus and methods described herein present little or no possibility that a device component will "pop off" or be otherwise detached, if the embedded structure is bent, or otherwise deformed.

In a non-limiting example, the chip or other device island and/or the interconnect is disposed close to the neutral mechanical plane of the overall embedded device. Through choice of suitable flexible polymer layers above and/or below the chips or other device islands and/or stretchable interconnects, the strain on the functional layer of the embedded device can be minimized. A functional layer herein can include the chips or other device islands and/or stretchable interconnects. In an example, the flexible polymer can be formed of a material having a Young's modulus of about 3 GPa. Non-limiting examples of such flexible polymers include a polyimide, such as but not limited to KAPTON® (available from DuPont, Delaware).

In an example, any of the systems or apparatus according to the principles herein, the chips 101 or other device islands and/or stretchable interconnects can be positioned such that the functional layer of the embedded device lies at a neutral mechanical plane (NMP) or neutral mechanical surface (NMS) of the system or apparatus. The NMP or NMS lies at the position through the thickness of the device layers for the system or apparatus where any applied strains are minimized or substantially zero. In an example, the functional layer of a system or apparatus according to the principles described herein includes a plurality of chips or other device islands and/or stretchable interconnects.

The location of the NMP or NMS can be changed relative to the layer structure of the system or apparatus through introduction of materials that aid in strain isolation in various layers of the system or apparatus. In various examples, polymer materials described herein can be introduced to serve as strain isolation materials. For example, the encapsulating material described hereinabove also can be used to position the NMP or NMS, e.g., by varying the encapsulating material type and/or layer thickness. For example, the thickness of encapsulating material disposed over the functional layers described herein may be modified (i.e., decreased or increased) to depress the functional layer relative to the overall system or apparatus thickness, which can vary the position of the NMP or NMS relative to the functional layer. In another example, the type of encapsulating, including any differences in the elastic (Young's) modulus of the encapsulating material.

In another example, at least a partial intermediate layer of a material capable of providing strain isolation can be disposed between the functional layer and the flexible substrate to position the NMP or NMS relative to the functional layer. In an example, the intermediate layer can be formed from any of the polymer materials described herein, aerogel materials or any other material with applicable elastic mechanical properties.

Based on the principles described herein, the NMP or NMS can be positioned proximate to, coincident with or adjacent to a layer of the system or apparatus that includes the strain-sensitive component, such as but not limited to the functional layer. The layer can be considered "strain-sensitive" if it is prone to fractures or its performance can be otherwise impaired in response to a level of applied strain. In an example where the NMP or NMS is proximate to a strain-sensitive component rather than coincident with it, the position of the NMP or NMS may still provide a mechanical benefit to the strain-sensitive component, such as substantially lowering the strain that would otherwise be exerted on the strain-sensitive component in the absence of strain isolation layers. In various examples, the NMS or NMP layer is considered proximate to the strain-sensitive component that provides at least 10%, 20%, 50% or 75% reduction in strain in the strain-sensitive component for a given applied strain, e.g., where the embedded device is deformed.

In various examples, the encapsulating material and/or the intermediate layer material may be disposed at positions relative to the embedded device that are coincident with the strain-sensitive component. For example, portions of the encapsulating material and/or the intermediate layer material may be interspersed with portions of the strain-sensitive component, through the embedding layer, including at positions within the functional layer.

Figure 3A:
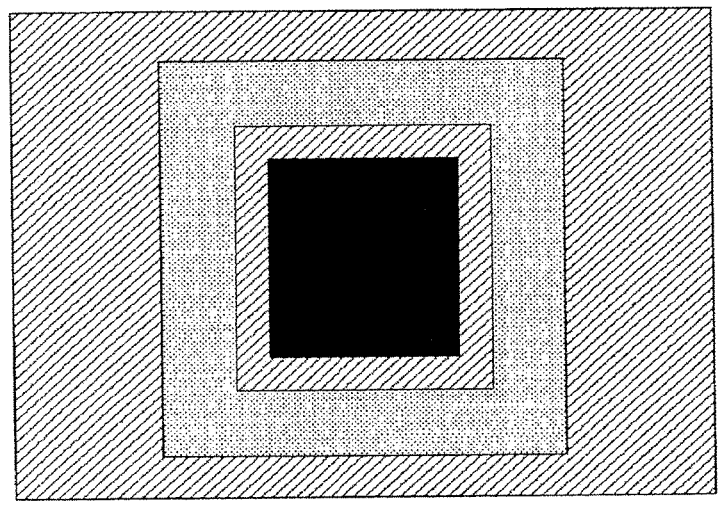
FIGS. 3A-3E illustrate an example manufacturing process for embedding a thin chip in standoff well region formed in an conductive layer, according to the principles described herein.

FIGS. 3A-3E show an example method for embedding a thinned chip in a standoff well region created in an conductive layer. FIG. 3A provides a top view and cross-sectional view of a thin chip 301 disposed on a flexible polymer 304 and within a standoff well region 302 defined by standoffs 303. As described above, the process can begin with a substrate formed as a metal coated flexible polymer sheet. The metal-coating can then be pattered to create the standoffs 303. In another example, alignment marks can be formed in the metal layer during the pattering process to create the standoffs. The alignment marks can assist in properly registering the thin chip 101 within the standoff well region 302.

Figure 3B:
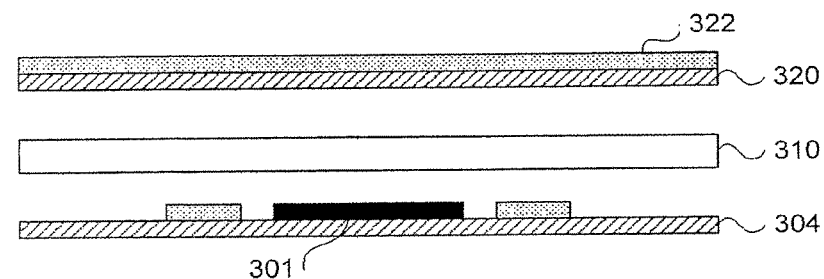

As illustrated in FIG. 3B, additional processing can be performed on the apparatus including the standoffs 303 and the thin chip 301 disposed within the standoff well region 302. For example, as illustrated in FIG. 3B, an adhesive 310 can be disposed over the thin chip. As described above, the adhesive 310 can be caused to flow within the standoff well region and around the thin chip 301 as a result of a temperature treatment. As also illustrated in FIG. 3B, an additional polymer sheet 320 can be disposed over the apparatus including the thin chip 301. As described above, and as in this example, the second flexible polymer 320 can be coupled with a second conductive layer 322. In one examples, the layers 320 and 322 are the same as the respective polymer layer 304 and conductive material layer 303 used in forming the standoff well region 302. In another example, the polymer layer 320 and conductive material layer 303 can be different from polymer layer 304 and conductive material layer 303. For example, the respective layers can comprise different materials and/or have different thicknesses. In an example, the adhesive polymer layer 310 can be DuPont™ PYRALUX® Bond-Ply. In another example, the material of adhesive polymer layer 310 can be selected such that it is non-conductive (a dielectric) and capable of adhering flexible polymer layers.

Figure 3C:
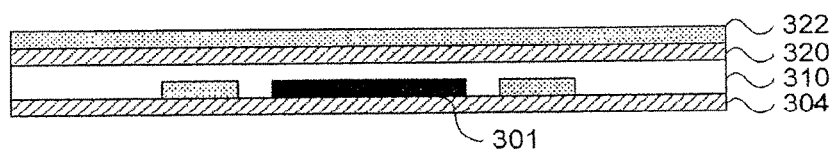

As illustrated in FIG. 3C, the layered structure of FIG. 3B can be, heat treated and cured such that the adhesive layer 310 is caused to flow around the thin chip 301 and within the standoff well region 302. In some examples, standoffs 303 can be taller than the thin chip 301, and the second polymer layer 320 is not in contact with the thin chip 301 when the curing process is completed.

Figure 3D:
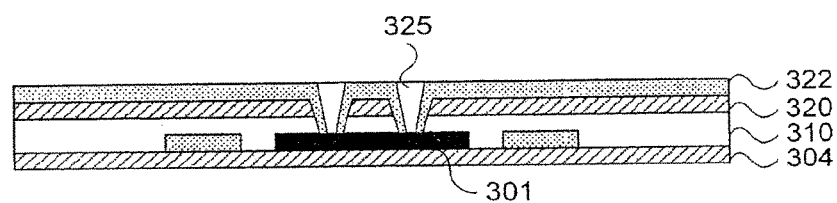

As illustrated in FIG. 3D, vias can be generated as channels through the top conductive layer 322, the top flexible polymer sheet 320, and the adhesive layer 310 to the thin chip 301. Once the vias have been created, the vias can be electroplated or filled through sputtering to create electrical vias 325 from the top conductive layer 322 to the electrical contact pad of the thin chip 301.

Figure 3E:
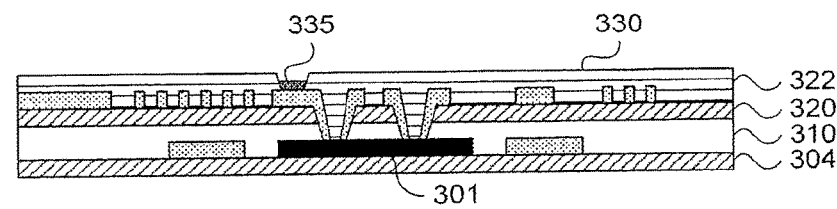

As illustrated in FIG. 3E, the conductive layer 322 can then be patterned. An overlay 330 can be applied to the top conductive layer 322. In some implementations, the overlay 330 is non-conductive. The overlay can be patterned to expose the underlying metal and, as in this example, an additional tarnish-resistant metallization 335 can be added to the exposed metal 322, to protect the exposed metal 322 from reacting with oxygen, water and other components of the environment. Such an example device can be between about 10 microns and about 100 microns in height. In another example, as described above, the embedded device also can be encapsulated to increase the overall thickness of the multilayer embedded device. For example, subsequent encapsulation steps can increase the multilayer embedded device thickness to about 70 microns, about 80 microns, or to about 100 microns. Encapsulation can increase the durability of the multilayer embedded device. Further, the encapsulation can be used to place the functional layer of the multi layer embedded device at the NMS of the structure.

Figure 4:
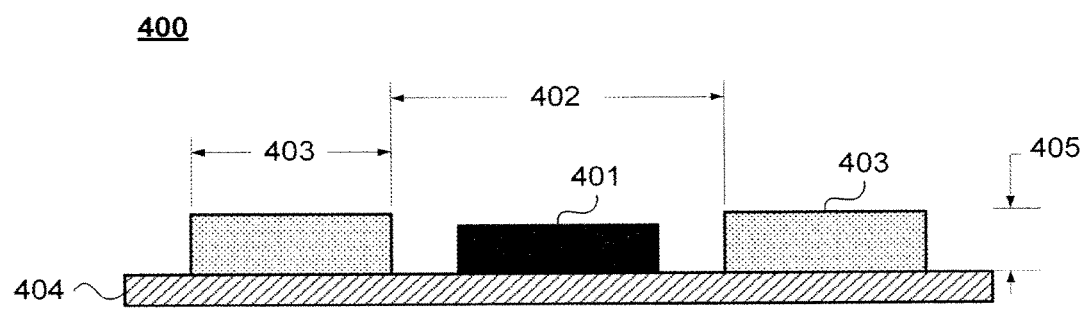
FIG. 4 shows a cross sectional view of an example apparatus that includes a thin chip disposed in a well region, according to the principles described herein.

FIG. 4 shows a cross sectional view of another example apparatus 400 that is formed from a thin chip 401 embedded in a polymer well region 402 according to the principles described herein. In this example, as with any other example herein, the thin chip 401 can be a thinned chip. The polymer well region 402 is formed from at least one polymer wall 403 bordering exposed portions of a layer of conductive material 404. The polymer wall 403 forms a wall of the polymer well region 402, thereby providing the polymer well region. In this example, the thin chip 401 is disposed on the exposed portions of the conductive material 404 proximate to a polymer wall 403. The polymer wall 403 can have a height 405 that is comparable to the height of the thin chip 401. In other examples, polymer wall 403 can have a height 405 that is greater than or less than the height of the thin chip 401.

In the example systems, apparatus and methods described herein, the thin chip 401 can be one or more passive electronic components and/or active electronic components. Non-limiting examples of components that can be embedded according to any of the principles described herein include a transistor, an amplifier, a photodetector, a photodiode array, a display, a light-emitting device, a photovoltaic device, a sensor, a LED, a semiconductor laser array, an optical imaging system, a large-area electronic device, a logic gate array, a microprocessor, an integrated circuit, an electronic device, an optical device, an opto-electronic device, a mechanical device, a microelectromechanical device, a nanoelectromechanical device, a microfluidic device, a thermal device, or other device structures.

In an example, embedded devices according to the principles described herein can be formed by embedding a plurality of chips (or other device islands) and/or a plurality of the interconnects in the polymer well region formed in the flexible polymer according to the principles herein. In an example, the embedded device (e.g., thin chip 401) can be formed from an integrated device, or formed from a plurality of chips (or other device islands) interconnected by a plurality of interconnects, that is embedded according to the principles herein.

The thin chip 401 (including an integrated device or device island as described herein) can be made thinner than the thickness of the flexible polymer layer 404 from which the polymer walls 403 of the polymer well region 402 is created. The conductive material coating can include, but is not limited to, metal traces or other metal coatings. The polymer well region 402 can be formed in the flexible polymer through, e.g., etching through to the surface of the conductive material 404, drilling, or laser ablation of the flexible polymer. After the conductive material coating on the polymer layer has been patterned and the polymer well region formed, the chip (including any device island) can be disposed and fixed between walls of the polymer "well," creating features above the polymer that are roughly the same height as the walls of the polymer well region. In other examples, the height 405 of the polymer wall 403 can be greater than or less than the height of the thin chip 401.

In various examples, the polymer well region 402 can be formed such that the positioned chip or other device island is shorter than or approximately equal to the well height 405. In other examples, the polymer well region 402 can be formed such that the positioned thin chip 401 (including a device island and/or an interconnect) is taller than the height of the walls of the well. The polymer walls 403 of the polymer well region 403 can be about 80%, about 90%, about, 100%, about 110%, about 120%, about 140%, or about 150% of the thickness of the thin chip 401 (including a device island and/or interconnect). In other examples, the polymer walls 403 of the polymer well region 403 can be about twice the thickness of the thin chip 401 or other device island and/or interconnect.

Similarly to the example structures in FIGS. 5A-5E, the polymer well region can have different conformations. FIGS. 5A-5E show non-limiting examples of different conformations of the polymer well region. As illustrated, the polymer well region 402 (including the polymer walls 403) can have a square shape, a rectangular shape, a rounded or other donut shape, or any other polygonal shape, such that a chip or other device island and/or interconnect can be disposed therein.

Figure 5A:
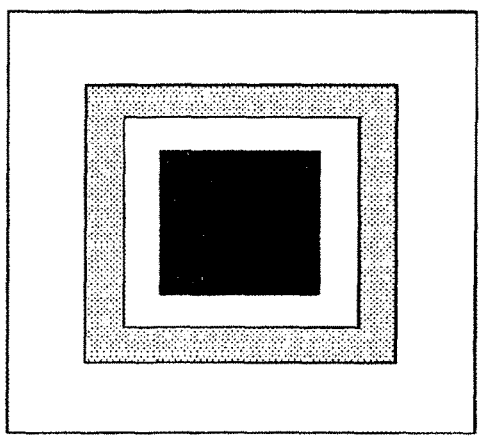
FIGS. 5A-5E show example configurations of well regions, according to the principles described herein.
Figure 5B:
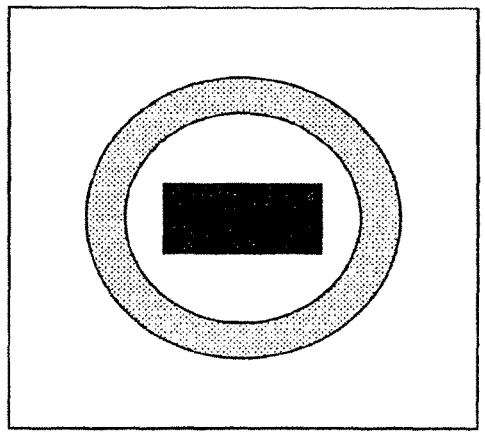
Figure 5C:
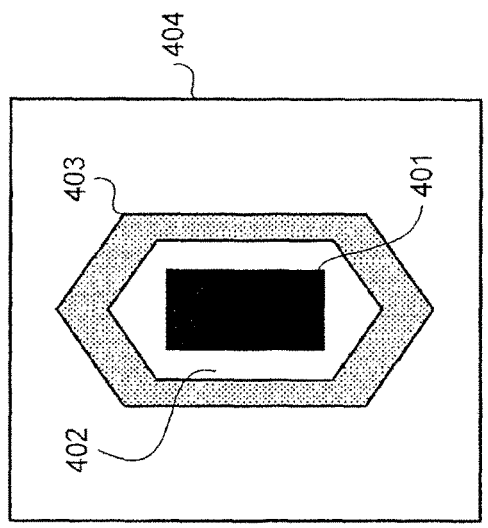
Figure 5E:
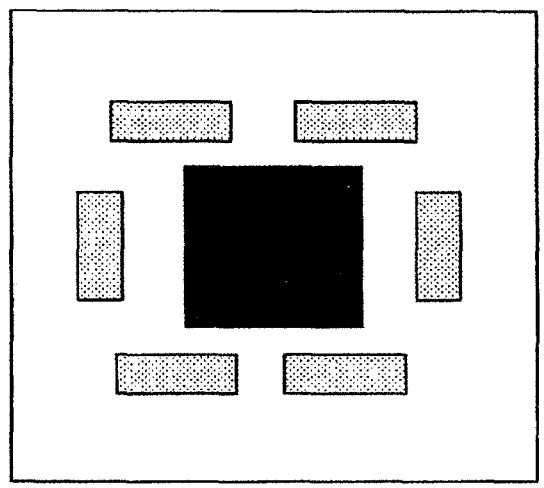
Figure 5D:
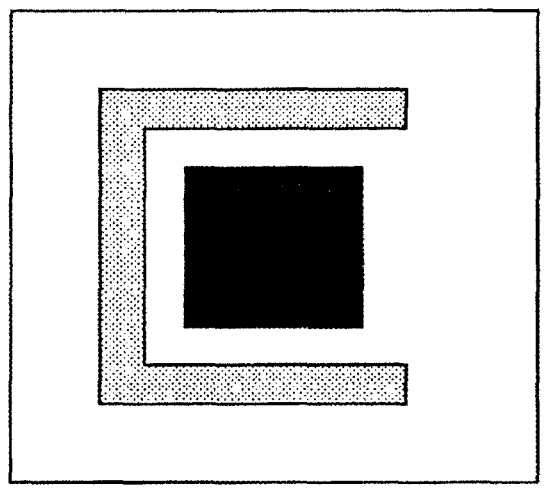

FIG. 5D shows a non-limiting example polymer well region (including the polymer walls) that is fabricated to not completely surround the thin chip (including a device island and/or the interconnect). In this example, the polymer well region 402 borders three sides of the thin chip 401. In the non-limiting example of FIG. 5E, the polymer well region (including the polymer walls) is fabricated to border portions of the sides of the thin chip 401 (including a device island and/or the interconnect), with some gaps in portions of the polymers of the polymer well regions.

In some examples, and similarly to as described in connection with FIG. 3 above, an adhesive can be caused to flow around the thin chip 401 (including any other device island and/or interconnect). For example, the adhesive can be caused to flow using a heat-treatment process. In an example, the heat-treatment process can be carried out at temperatures that vary from about 60° C. to about 250° C. The stacked layers, including the device islands and/or interconnects and adhesive layer between the flexible polymer walls 103 can be positioned between two metal plates and brought up to temperature to cause the adhesive to flow around the device islands and/or interconnects.

FIGS. 6A-6G illustrates an example process to fabricate an apparatus having a thin chip embedded within a polymer well region. In the example of FIGS. 6A-6G, a cavity is generated in the flexible polymer layer down to a portion of the metal layer to create a polymer well region. The thin chip is disposed within the polymer well region on a portion of the exposed conductive material. In this example, an electrical communication can be established between the thin chip 401 and the conductive material of the substrate without use of vias if, for example, a conductive adhesive is disposed between the thin chip and the conductive material. In an example, several of the apparatus according to this example can be stacked to create a multilayered device.

Figure 6A:
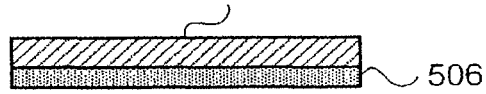
FIGS. 6A-6G illustrate an example manufacturing process based on a thin chip embedded in a polymer well region, according to the principles described herein.
Figure 6B:
Figure 6C:
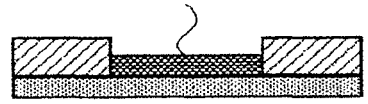

FIG. 6A shows a substrate that includes a flexible polymer layer 505 disposed on a layer of conductive material 506. The polymer layer 505 can include, as non-limiting examples, a polyimide film such as but not limited to a DuPont™KAPTON® film), or a liquid crystal polymer, with a thickness of about 20 µm, about 30 µm, about 35 µm, about 45 µm, about 55 µm, about 66 µm, or about 75 µm. The conductive material layer 506 can be a copper layer, and can be about 5 µm, about 8 µm, about 15 µm, about 20 µm, or about 30 µm thick.

As illustrated in FIG. 5B, a cavity can be formed in the polymer layer 505 to generate a polymer well region. For example, the polymer layer 505 can be etched to expose the conductive material layer 506. The cavity forms a polymer well region 507 including at least one polymer wall 504. In another example, the polymer well region 507 can be generated by a cavity formed from laser ablation, drilling, patterning, and/or die cutting. As illustrated in FIG. 5C, an adhesive 508 can be placed in the polymer well region 507 on a portion of the conductive material 506 prior to placement of the thin chip. In some examples, the adhesive 508 has low stress properties after being cured, so as to avoid cracking the die during the curing step. In this example, the adhesive 508 can be a thermoset adhesive that can withstand the temperatures of later processing without re-flowing. The adhesive 508 can be thermally and/or electrically conductive, or non-conductive (dielectric). For example, an electrically conductive adhesive can be used to establish an electrical connection between the die chip and a portion of the conductive material layer 506. In one example, this electrically conductive adhesive material can be employed to establish a ground plane connection for the completed device between the underside of the thin chip and the conductive material layer 506.

In another example, the polymer layer 505 does not include a base conductive material layer 506. In this example, the cavity generated to create the polymer wall 503 and the polymer well region 507 does not extend completely through the polymer layer 505. Rather, the cavity is created through a portion of the thickness of the polymer layer 505, into which the die 504 is later embedded. This example can be used to provide embedded thin chips based on commercially-available polyimides or liquid crystal polymers, including the polymers of PCB boards, without need for the more expensive processing of a photo-definable spin-on polyimide.

Figure 6D:
Figure 6E:
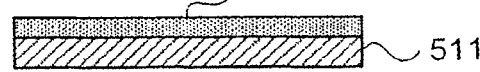
Figure 6E:
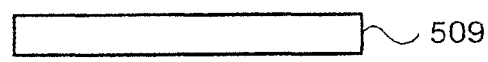
Figure 6E:

As illustrated in FIG. 6D, the thin chip die 504 is placed into the polymer well region 507. In some implementations, at this step, the adhesive 507 can be cured, securing the thin chip die 504 into the polymer well region 507. As illustrated in FIG. 6E, an adhesive polymer layer 509 can be disposed over the thin chip die in the polymer well region 507, and caused to flow into the area around the thin chip die through thermal processing. In the example of FIG. 6E, the adhesive 509 can be disposed between a polymer sheet 511 that includes a polymer layer 510 and the polymer well region 507. In some examples, the conductive material-clad polymer layer can be a metal-clad polyimide layer. In one examples, the layers 511 and 510 are the same as the respective polymer 505 and conductive material layer 506 used in forming the polymer well region 507. In another example, the polymer layer 511 and conductive material layer 510 can be different from polymer layer 505 and conductive material layer 506. For example, the respective layers can comprise different materials and/or have different thicknesses. In an example, the adhesive polymer layer 509 can be DuPont™ PYRALUX® Bond-Ply. In another example, the material of adhesive polymer layer 509 can be selected such that it is non-conductive (a dielectric) and capable of adhering flexible polymer layers.

Figure 6F:
Figure 6F:
Figure 6G:
Figure 6G:

As illustrated in FIG. 6F, the adhesive polymer layer 509, polymer layer 511, and conductive material layer 510 can be pressed onto the polymer well region and die layer. In this example, the layers can be coupled using vacuum lamination while being heated to a processing temperature. The vacuum lamination process can cause the adhesive polymer 509 to flow around the thin chip die 504, filling the polymer well region 507.

As illustrated in FIG. 6E, the top metal layer 510 and/or the bottom conductive material layer 506 can be patterned and additional circuitry applied. In some examples, such as the example of FIG. 6G, channels can be created through at least one of the polymer layers and conductive material layers. For example, channels can be created by laser ablation or reactive ion etching to form vias 512 from the top surface of the embedded system to the electrical contact pads of the thin chip die. The channels can then be metalized, e.g., by electroplating, evaporation, and/or sputtering, to create electrical communication to circuitry within the thin chips of the embedded device. For example, metalized vias 512 can facilitate electrical communication with the thin chip die's bond-pads or other such electrical contacts. In some implementations, the through channel can be created without previously adding additional conductive material to the die's bond-pads (a process referred to in the industry as bumping the die). As non-limiting examples, metals such as copper, titanium, titanium-tungsten alloy, gold, nickel, and chromium can be used to metalize the vias.

Figure 7A:
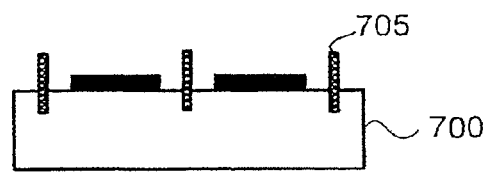
FIG. 7A-7D show an example thinning of a chip to generate a thinned chip, according to the principles described herein.
Figure 7B:
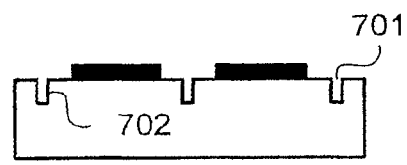
Figure 7C:
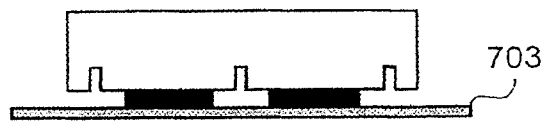
Figure 7D:

FIGS. 7A-7D show an example process that can be used to generate a thinned chip. In this example, a chip having a thicker substrate is thinned prior to being embedded according to any of the systems, methods and apparatus described herein. In this example, the chip dies can be thinned using a dicing before grinding (DBG) technique. In some examples, the DBG technique allows the thinning of chips to about 5 μm, about 8 μm, about 10 μm, about 15 μm, about 25 μm, about 35 μm or about 50 μm thickness. The DBG technique also can reduce the risk of wafer bowing that can be seen in other grinding techniques. As illustrated in FIG. 7A, the process can begin with the initial half die cut of the die with a dicing saw 705 or other dicing process. As illustrated in FIG. 7B, the channels 701 in the wafer 700 by the die cut are cut to a depth 702 that is used as a guide to the desired thickness of the thinned die. As illustrated in FIG. 7C, the wafer 700 can be turned over, and the dies are applied to a tape 703. The tape 703 can hold the wafer in place as the backside of the wafer is ground to the desired thickness. When the grinding process reaches the channels 701 used to indicate a stop, the thinned chip dies 704 are released from the wafer 700. In an example, a second layer of tape can be applied now-separate backs of the chips. The thin chips can then be released from the tape 703 by exposing tap 703 to ultraviolet light. The thinned chips 740 can be used in any of the processing described herein in connection with a thin chip, including thin chip 101 and thin chip 401.

Figure 8A:
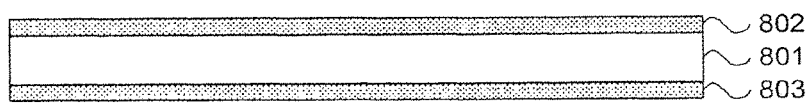
FIGS. 8A-8H illustrate example manufacturing processes that can be performed on an embedded thin chip, according to the principles described herein.

FIGS. 8A-8H show non-limiting examples of manufacturing processes that may be applied to one or more of the methods, apparatus, or systems described herein. For example, the manufacturing processes described in FIGS. 8A-8H can be performed on an embedded thin chip generated according to any of the systems, methods and apparatus described herein, including in FIGS. 1-7D. As illustrated in FIG. 8A, the processing can be applied to a polymer sheet 801 that includes a conductive metal coating on either side. In this example the conductive material layers 802 and 803 are 17.5 μm copper layers on a 75 μm thick KAPTON® substrate.

Figure 8B:
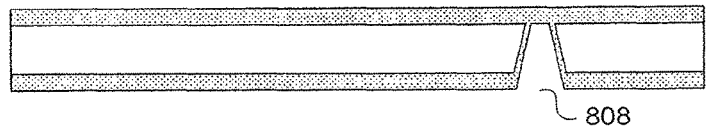
Figure 8C:
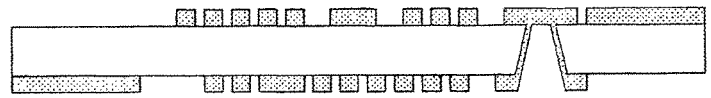

As illustrated in FIG. 8B, through channels are created from one conductive material layer to the second conductive material layer. The through channels are electroplated to create electrical vias 804. As illustrated in FIG. 8C, one or both of the conductive material layers 802 and 803 can be patterned.

Figure 8D:
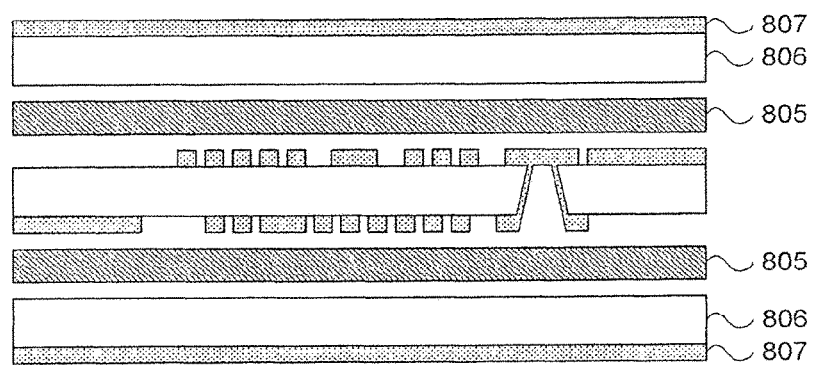

Next, as illustrated in FIG. 8D, an adhesive layer 806 is inserted between the patterned conductive material layers 802 and 803 and additional polymer sheets 806. In this example, each of the polymer sheets 806 are metal-coated to create conductive layers 807. In another example, one or both of the second polymer sheets 806 are not metal-coated.

Figure 8E:
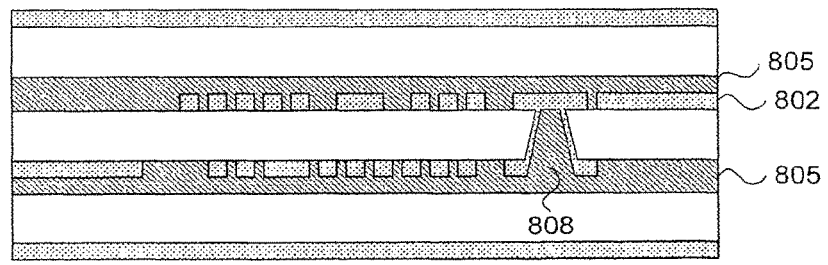
Figure 8F:
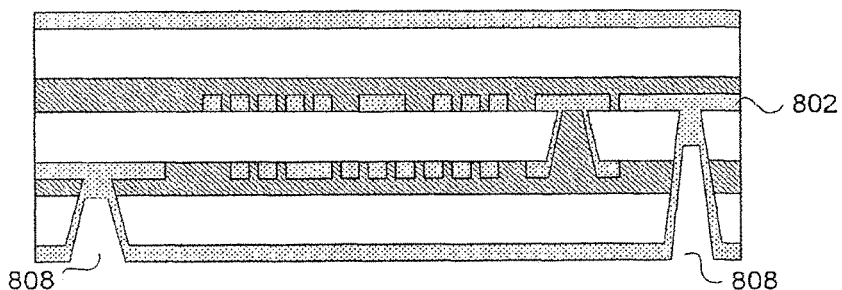

As illustrated in FIG. 8E, the adhesive layers 805 are subjected to heat and pressure. The heat and pressure cause the adhesive layers 805 to melt and flow into the gaps created by in the vias and the patterned conductive layers 802 and 803. Next, as illustrated in FIG. 8F, additional through channels are created and electroplated to connect the various conductive layers. In this example, the vias one or more layers. For example, via 808 electrically connects the bottom conductive layer 807 to internal conductive layer 802 and via 809 electrically connects bottom conductive layer 807 to internal conducive layer 803.

Figure 8G:
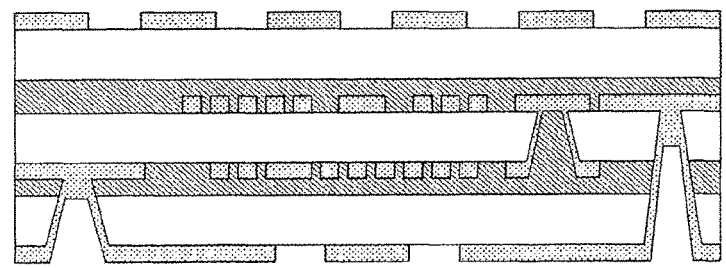
Figure 8H:
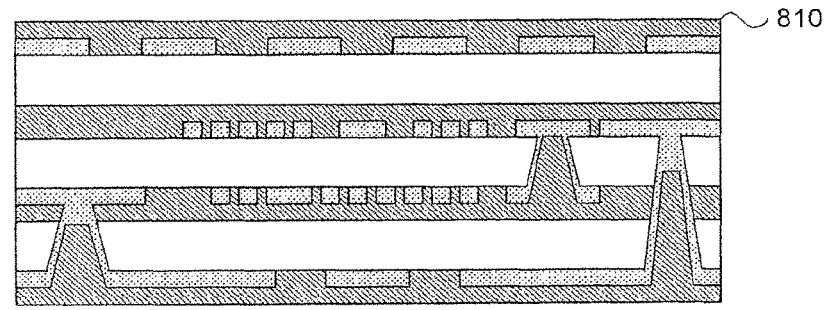

As illustrated in FIG. 8G, the now external conductive layers 807 can be patterned. In this example, both external conductive layers 807 are patterned, but in another example, one or none of the external layers 807 can be patterned. As illustrated in FIG. 8H, an overlay 810 can be applied to the external conductive layers 807. In another example, the overlay 810 can also be patterned. A corrosion and solder resistant metallization can be electro-deposited on any exposed copper traces.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be examples and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that inventive embodiments may be practiced otherwise than as specifically described. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention may be implemented in any of numerous ways. For example, some embodiments may be implemented using hardware, software or a combination thereof. When any aspect of an embodiment is implemented at least in part in software, the software code may be executed on any suitable processor or collection of processors, whether provided in a single device or computer or distributed among multiple devices/computers.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification, unless clearly indicated to the contrary, should be understood to mean "at least one."

The phrase "and/or," as used herein in the specification, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

As used herein in the specification, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A): in yet another embodiment, to at least one, optionally including more than one, A, and at least one, optionally including more than one, B (and optionally including other elements); etc

What is claimed:
1. An apparatus comprising:
   A) a substrate comprising a standoff well region, wherein:
      the substrate comprises a layer of a first conductive material disposed on a layer of a flexible and stretchable polymer, and
      a patterned portion of the first conductive material comprises a standoff bordering a portion of exposed flexible and stretchable polymer, thereby forming the standoff well region; and
   B) a sensor disposed within the standoff well region on a portion of the exposed flexible and stretchable polymer proximate to the standoff.

2. The apparatus of claim 1, wherein the sensor is embedded in the portion of the exposed flexible and stretchable polymer proximate to the standoff.

3. The apparatus of claim 1, wherein a height of the standoff greater than or about equal to a height of the sensor.

4. The apparatus of claim 1, wherein the standoff completely surrounds the sensor.

5. The apparatus of claim 1, wherein the standoff includes at least one gap between a plurality of standoffs that define the standoff well region.

6. An apparatus comprising:
   A) a substrate comprising a standoff well region, wherein:
      the substrate comprises a layer of a first conductive material disposed on a layer of a flexible and stretchable polymer, and
      a patterned portion of the first conductive material comprises a standoff bordering a portion of exposed flexible and stretchable polymer, thereby forming the standoff well region; and
   B) an electrical interconnect disposed within the standoff well region on a portion of the exposed flexible and stretchable polymer proximate to the standoff.

7. The apparatus of claim 6, wherein the electrical interconnect is embedded in the portion of the exposed flexible and stretchable polymer proximate to the standoff.

8. The apparatus of claim 6, wherein a height of the standoff greater than or about equal to a height of the electrical interconnect.

9. The apparatus of claim 6, wherein the electrical interconnect is a stretchable serpentine interconnect.

10. The apparatus of claim 6, wherein the electrical interconnect is one or more interconnects electrically connecting a plurality of device islands.

11. The apparatus of claim 10, wherein a height of the standoff is greater than or equal to a height of the one or more electrical interconnects and the plurality of device islands.

12. The apparatus of claim 10, wherein the plurality of device islands include one or more thinned chips disposed on the flexible and stretchable polymer.

13. The apparatus of claim 10, further comprising at least one additional layer disposed on the first conductive material or on the flexible and stretchable polymer, wherein the at least one additional layer positions the one or more interconnects and the plurality of device islands at a neutral mechanical plane of the apparatus.

14. The apparatus of claim 6, wherein the standoff completely surrounds the electrical interconnect.

15. The apparatus of claim 6, wherein the standoff includes at least one gap between a plurality of standoffs that define the standoff well region.

16. A method for embedding electrical interconnects, the method comprising:

A) providing a substrate comprising a standoff well region, wherein:
   the substrate comprises a layer of a first conductive material disposed on a layer of a flexible and stretchable polymer, and
   a patterned portion of the first conductive material comprises a standoff bordering a portion of exposed flexible and stretchable polymer, thereby forming the standoff well region; and
B) disposing an electrical interconnect on a portion of the exposed flexible and stretchable polymer proximate to the standoff.

17. The method of claim 16, wherein the electrical interconnect is further embedded in the portion of the exposed flexible and stretchable polymer proximate to the standoff.

18. The method of claim 16, wherein the electrical interconnect is a stretchable serpentine interconnect.

19. The method of claim 16, wherein the electrical interconnect is a one or more interconnects electrically connecting a plurality of device islands.

* * * * *